(12) United States Patent
Park et al.

(10) Patent No.: US 11,610,975 B2
(45) Date of Patent: *Mar. 21, 2023

(54) SEMICONDUCTOR DEVICES HAVING MULTIPLE BARRIER PATTERNS

(71) Applicant: Samsung Electronics Co., Ltd., Suwon-si (KR)

(72) Inventors: Jongho Park, Suwon-si (KR); Byounghoon Lee, Suwon-si (KR); Seungkeun Cha, Yongin-si (KR); Wandon Kim, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/470,102

(22) Filed: Sep. 9, 2021

(65) Prior Publication Data

US 2021/0408260 A1 Dec. 30, 2021

Related U.S. Application Data

(63) Continuation of application No. 16/886,881, filed on May 29, 2020, now Pat. No. 11,145,738.

(30) Foreign Application Priority Data

Jul. 22, 2019 (KR) .......................... 10-2019-0088504

(51) Int. Cl.
*H01L 29/06* (2006.01)
*H01L 29/49* (2006.01)
(Continued)

(52) U.S. Cl.
CPC ...... *H01L 29/4966* (2013.01); *H01L 29/0638* (2013.01); *H01L 29/1058* (2013.01); *H01L 29/4238* (2013.01); *H01L 29/45* (2013.01)

(58) Field of Classification Search
CPC ............. H01L 29/0638; H01L 29/1058; H01L 29/4238; H01L 29/45; H01L 29/4966
(Continued)

(56) References Cited

U.S. PATENT DOCUMENTS 8,294,202 B2 10/2012 Jangjian et al.
9,136,131 B2 9/2015 Konduparthi et al.
(Continued)

FOREIGN PATENT DOCUMENTS

KR 101922280 B1 11/2018

*Primary Examiner* — Monica D Harrison
(74) *Attorney, Agent, or Firm* — Myers Bigel, P.A.

(57) ABSTRACT

Semiconductor devices are provided. A semiconductor device includes a first active pattern on a first region of a substrate, a pair of first source/drain patterns on the first active pattern, a first channel pattern between the pair of first source/drain patterns, and a gate electrode that extends across the first channel pattern. The gate electrode is on an uppermost surface and at least one sidewall of the first channel pattern. The gate electrode includes a first metal pattern including a p-type work function metal, a second metal pattern on the first metal pattern and including an n-type work function metal, a first barrier pattern on the second metal pattern and including an amorphous metal layer that includes tungsten (W), carbon (C), and nitrogen (N), and a second barrier pattern on the first barrier pattern. The second barrier pattern includes the p-type work function metal.

20 Claims, 55 Drawing Sheets

(51) Int. Cl.
*H01L 29/45* (2006.01)
*H01L 29/423* (2006.01)
*H01L 29/10* (2006.01)

(58) Field of Classification Search
USPC ........................................................ 257/369
See application file for complete search history.

(56) References Cited

U.S. PATENT DOCUMENTS

| | | |
|---|---|---|
| 9,859,273 B2 | 1/2018 | Chen et al. |
| 9,922,884 B2 | 3/2018 | Bao et al. |
| 11,145,738 B2 * | 10/2021 | Park .................... H01L 29/1058 |
| 2016/0372382 A1 | 12/2016 | Lee et al. |
| 2018/0132640 A1 | 5/2018 | William |
| 2019/0088798 A1 | 3/2019 | Kim et al. |
| 2019/0096680 A1 | 3/2019 | Wei et al. |

\* cited by examiner

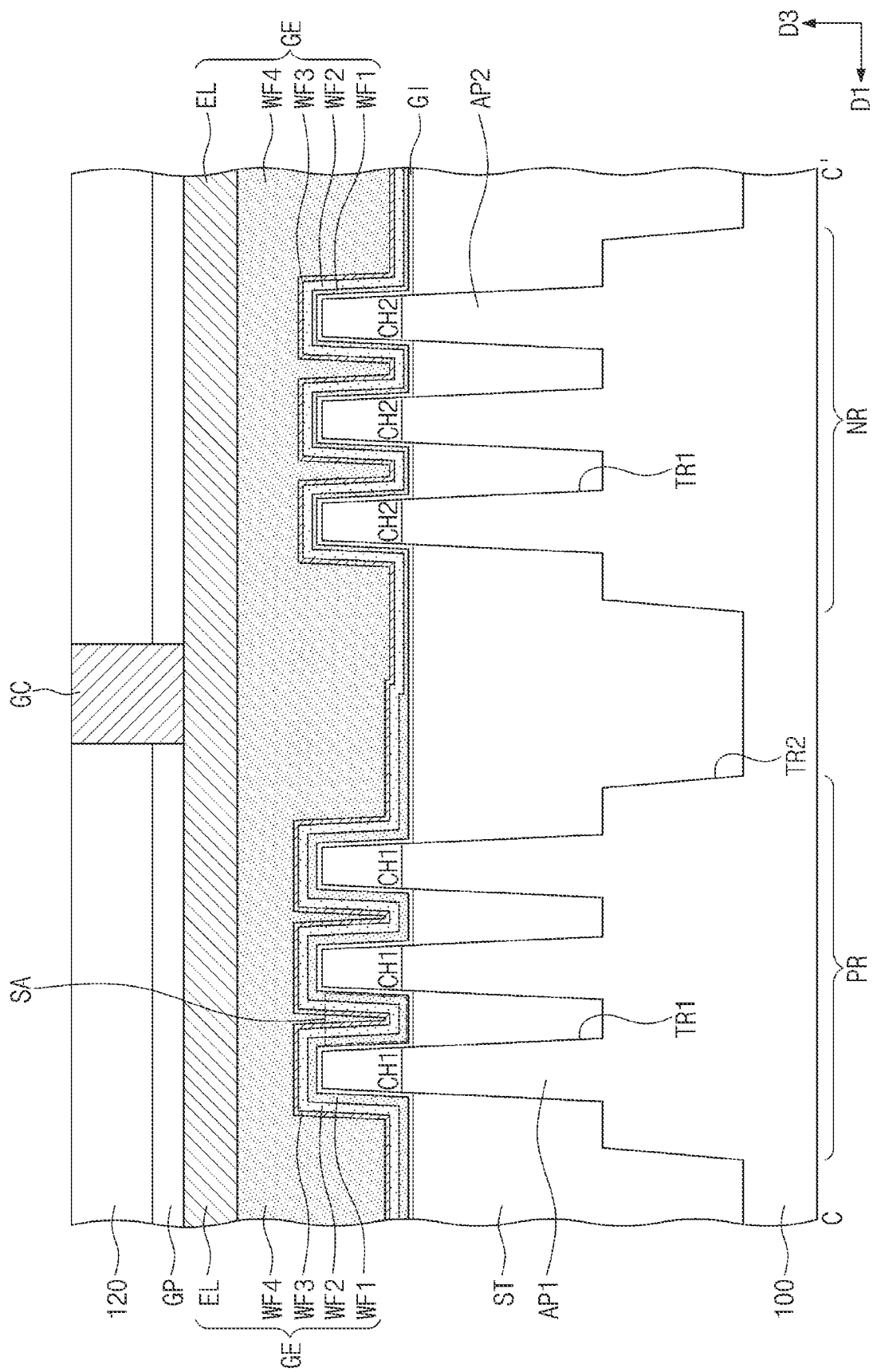

SEMICONDUCTOR DEVICES HAVING MULTIPLE BARRIER PATTERNS

CROSS-REFERENCE TO RELATED APPLICATIONS

The present application claims priority under 35 U.S.C. § 120 as a continuation of U.S. patent application Ser. No. 16/886,881, filed May 29, 2020, which claims priority under 35 U.S.C. § 119 to Korean Patent Application No. 10-2019-0088504 filed on Jul. 22, 2019 in the Korean Intellectual Property Office, the entire contents of each of which are hereby incorporated by reference.

BACKGROUND

The present inventive concepts relate to semiconductor devices and, more particularly, to semiconductor devices including a field effect transistor and methods of fabricating the same. A semiconductor device may include an integrated circuit including metal oxide semiconductor field effect transistors (MOSFETs). As sizes and design rules of the semiconductor device are gradually decreased, the MOSFETs have been scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a semiconductor device with improved electrical characteristics.

According to some example embodiments of the present inventive concepts, a semiconductor device may comprise: a first active pattern on a first region of a substrate; a pair of first source/drain patterns on the first active pattern; a first channel pattern between the pair of first source/drain patterns; and a gate electrode that extends across the first channel pattern. The gate electrode may be on an uppermost surface and at least one sidewall of the first channel pattern. The gate electrode may include: a first metal pattern including a p-type work function metal; a second metal pattern on the first metal pattern, the second metal pattern including an n-type work function metal; a first barrier pattern on the second metal pattern, the first barrier pattern including an amorphous metal layer that includes tungsten (W), carbon (C), and nitrogen (N); and a second barrier pattern on the first barrier pattern. The second barrier pattern may include the p-type work function metal.

According to some example embodiments of the present inventive concepts, a semiconductor device may comprise: a substrate that includes an active pattern; a device isolation layer that is on a lower sidewall of the active pattern, an upper portion of the active pattern protruding beyond an uppermost surface of the device isolation layer; a pair of source/drain patterns on the active pattern; a channel pattern between the pair of source/drain patterns; and a gate electrode that extends across the channel pattern. The gate electrode may include: a first metal pattern including a p-type work function metal; a second metal pattern on the first metal pattern, the second metal pattern including an n-type work function metal; a first barrier pattern on the second metal pattern, the first barrier pattern including an amorphous metal layer that includes tungsten (W), carbon (C), and nitrogen (N); a second barrier pattern on the first barrier pattern, the second barrier pattern including the p-type work function metal; and a third barrier pattern between the second metal pattern and the first barrier pattern. The third barrier pattern may include the p-type work function metal.

According to some example embodiments of the present inventive concepts, a semiconductor device may comprise: a substrate that includes a plurality of active patterns spaced apart from each other in a first direction; a device isolation layer that is on a lower sidewall of each of the active patterns, an upper portion of each of the active patterns protruding beyond an uppermost surface of the device isolation layer; a pair of source/drain patterns on each of the active patterns; a channel pattern between the pair of source/drain patterns, a gate electrode that extends in the first direction across the channel patterns; and a gate dielectric pattern between the gate electrode and the channel patterns. The gate dielectric pattern may be on the upper portion of each of the active patterns. The gate electrode may include: a first metal pattern including a p-type work function metal; a second metal pattern on the first metal pattern, the second metal pattern including an n-type work function metal; a first barrier pattern on the second metal pattern, the first barrier pattern including an amorphous metal layer that includes tungsten (W), carbon (C), and nitrogen (N); and a second barrier pattern on the first barrier pattern. The second barrier pattern may include the p-type work function metal. A thickness of the first barrier pattern may fall within a range of 1 nanometers (nm) to 5 nm. A thickness of the second barrier pattern may fall within a range of 5 nm to 70 nm. The first barrier pattern may be between adjacent ones of the channel patterns that are spaced apart from each other in the first direction.

BRIEF DESCRIPTION OF THE DRAWINGS

FIGS. 2A, 2B, 2C, and 2D illustrate cross-sectional views respectively taken along lines A-A', B-B', C-C', and D-D' of FIG. 1.

DETAILED DESCRIPTION

Figure 1:
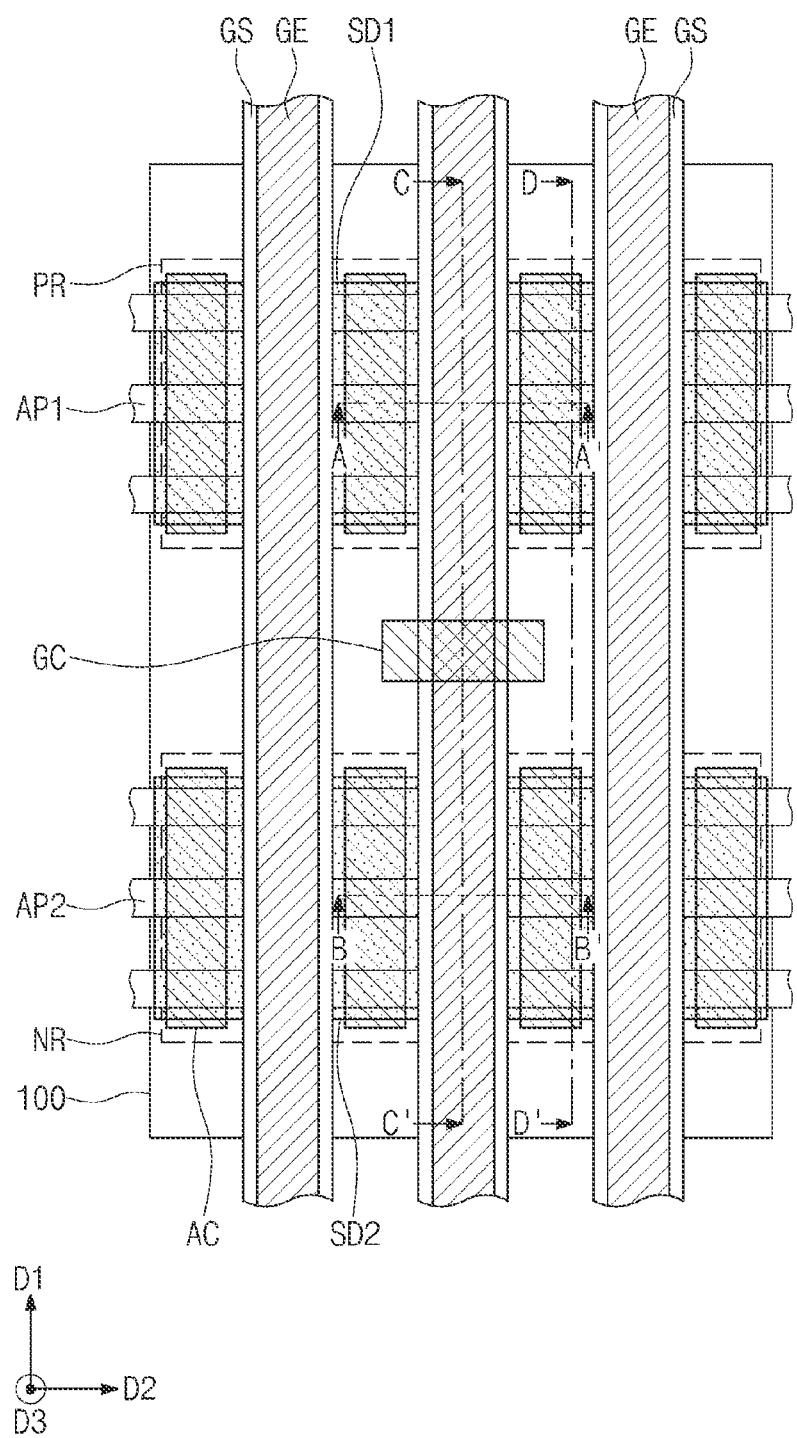
FIG. 1 illustrates a plan view showing a semiconductor device according to some example embodiments of the present inventive concepts.
Figure 2A:
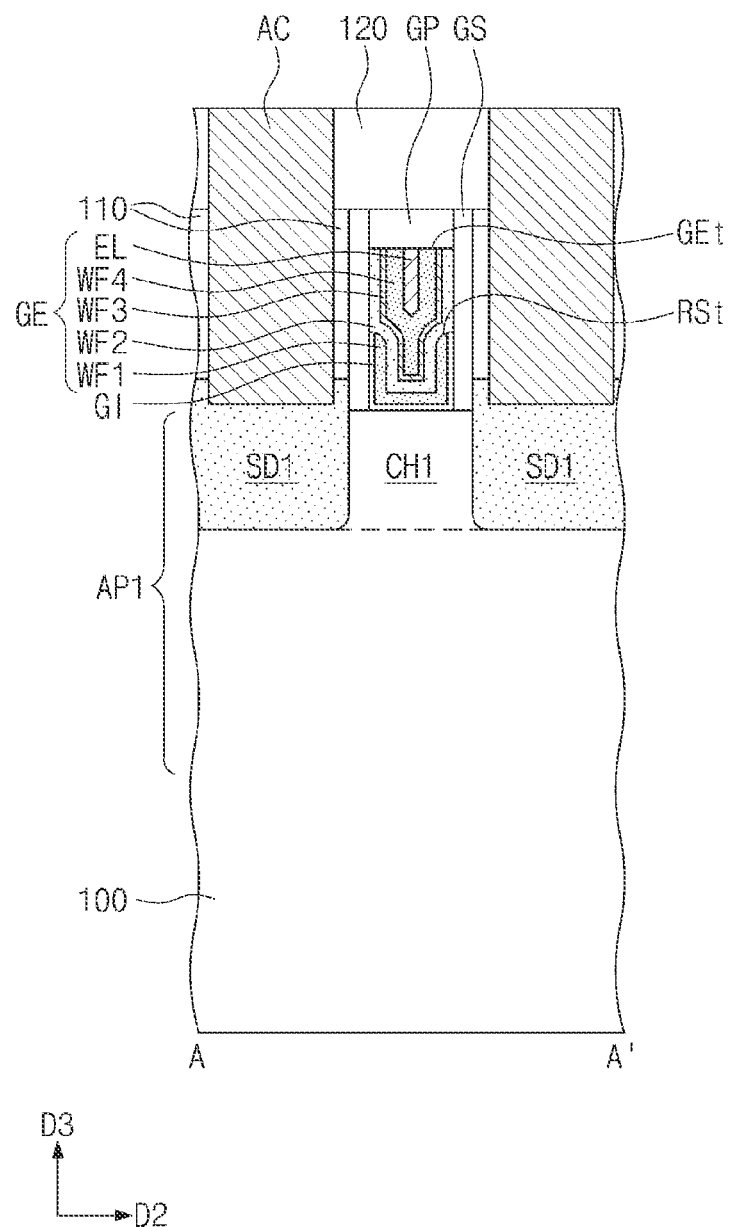
Figure 2B:
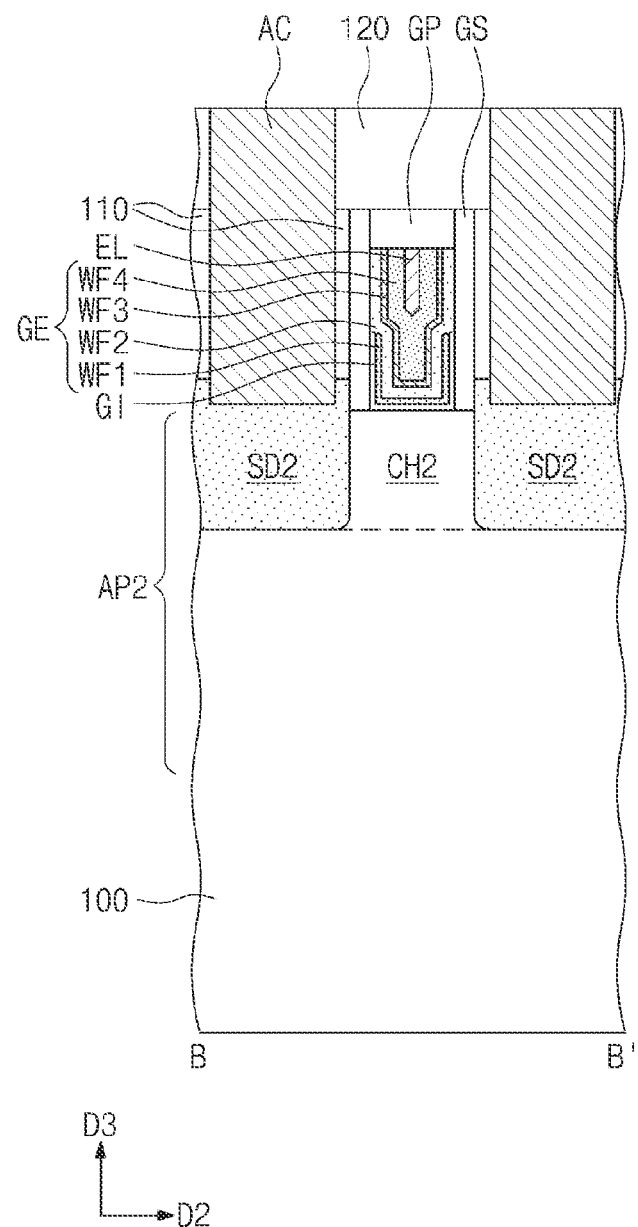
Figure 2D:
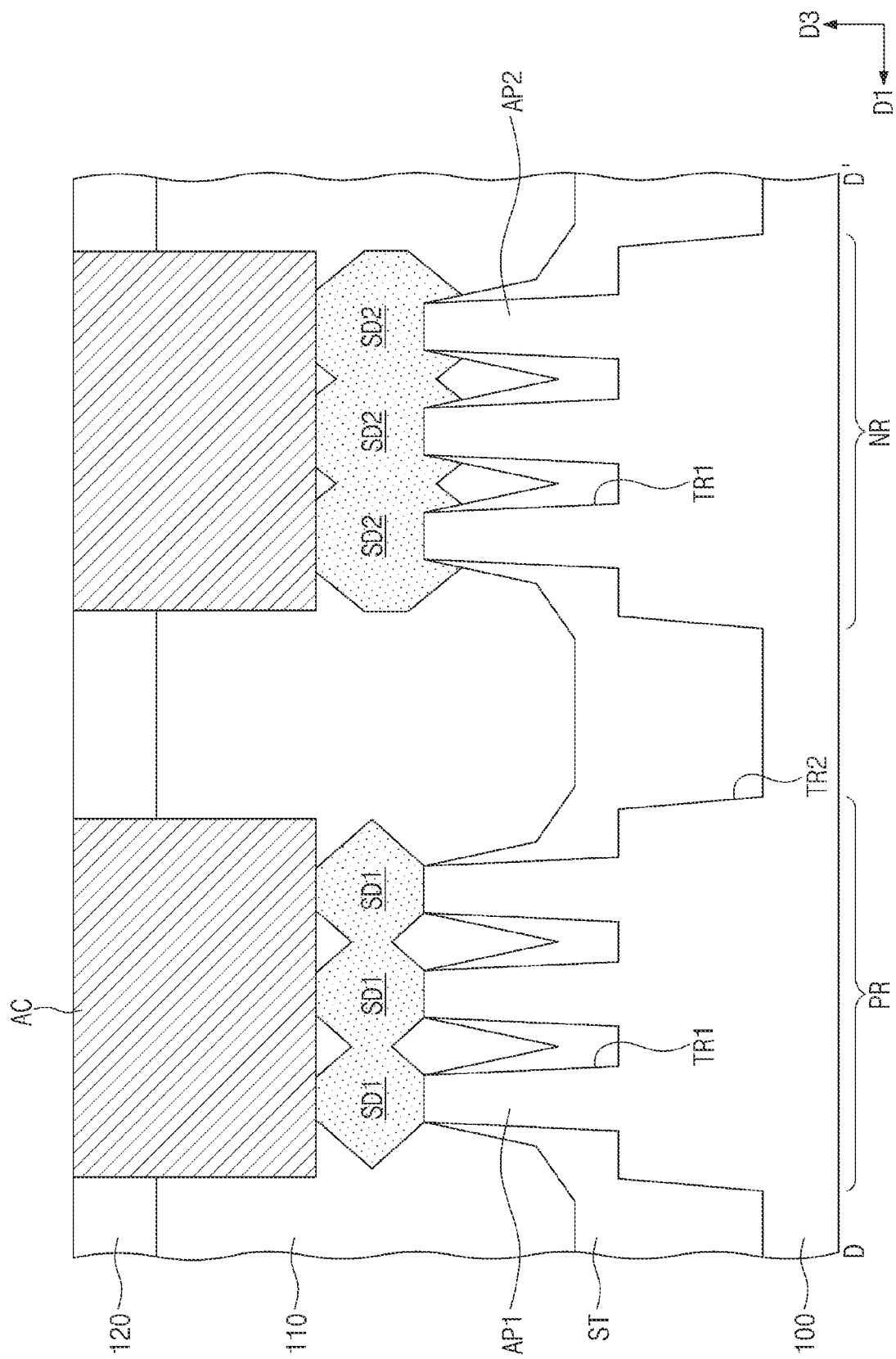
Figure 2E:
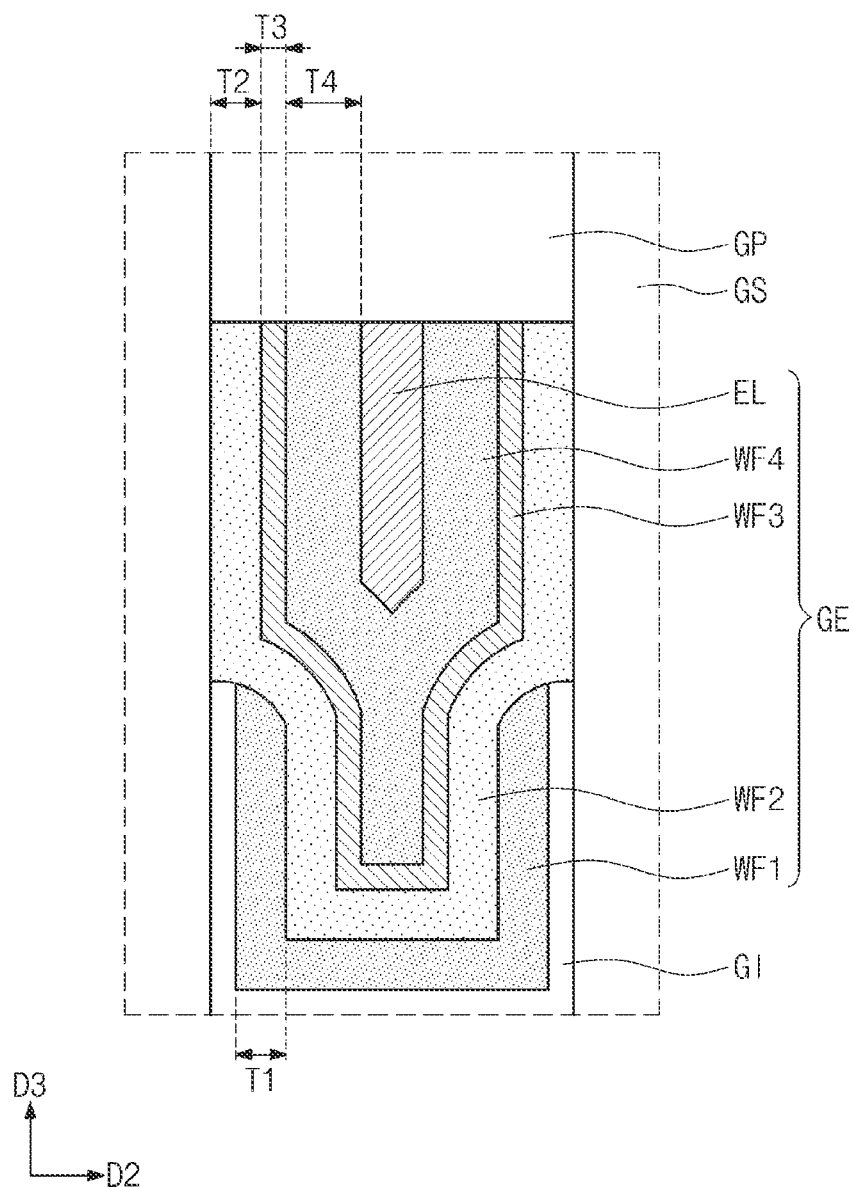
FIG. 2E illustrates an enlarged cross-sectional view showing a gate electrode of FIG. 2A.

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1. FIG. 2E illustrates an enlarged cross-sectional view showing a gate electrode of FIG. 2A.

Referring to FIGS. 1 and 2A to 2E, a substrate 100 may be provided to include a first region PR and a second region NR. The substrate 100 may be a compound semiconductor substrate or a semiconductor substrate including silicon (Si), germanium (Ge), silicon-germanium (SiGe), or the like. For example, the substrate 100 may be a silicon substrate.

In some embodiments, the first region PR and the second region NR may be logic cell regions, each of which includes logic transistors constituting a logic circuit of a semiconductor device. For example, logic transistors constituting a logic circuit may be disposed on the logic cell region of the substrate 100. The first region PR and the second region NR may include at least one of the logic transistors. The first region PR may be a PMOSFET area, and the second region NR may be an NMOSFET area.

The first region PR and the second region NR may be defined by a second trench TR2 formed on an upper portion of the substrate 100. The second trench TR2 may be positioned between the first region PR and the second region NR. The first region PR and the second region NR may be spaced apart from each other in a first direction D1 across the second trench TR2. Each of the first and second regions PR and NR may extend in a second direction D2 intersecting the first direction D1.

First active patterns AP1 and second active patterns AP2 may be provided respectively on the first region PR and the second region NR. The first and second active patterns AP1 and AP2 may extend in the second direction D2. The first and second active patterns AP1 and AP2 may be vertically protruding portions of the substrate 100. A first trench TR1 may be defined between adjacent first active patterns AP1 and between adjacent second active patterns AP2. The first trench TR1 may be shallower (in a third direction D3) than the second trench TR2.

A device isolation layer ST may fill the first and second trenches TR1 and TR2. The device isolation layer ST may include a silicon oxide layer. The first and second active patterns AP1 and AP2 may have their upper portions that vertically protrude beyond the device isolation layer ST (see FIG. 2C). Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. The first and second source/drain patterns SD1 and SD2 may have their top surfaces at a higher level than that of top surfaces of the first and second channel patterns CH1 and CH2. For example, the first source/drain patterns SD1 may include a semiconductor element (e.g., SiGe) whose lattice constant is greater than that of a semiconductor element of the substrate 100. Therefore, first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running (i.e., extending) across the first and second active patterns AP1 and AP2. The gate electrodes GE may be spaced apart from each other in the second direction D2. The gate electrodes GE may vertically overlap the first and second channel patterns CH1 and CH2. Each of the gate electrodes GE may surround the top surface and opposite sidewalls of each of the first and second channel patterns CH1 and CH2 (see FIG. 2C).

A pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include one or more of silicon carbonitride (SiCN), silicon carbon oxynitride (SiCON), and silicon nitride (SiN). In some embodiments, the gate spacers GS may include a multi-layer structure including two or more of SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of silicon oxynitride (SiON), SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the top surface and opposite sidewalls of the first channel pattern CH1. The gate dielectric pattern GI may cover the top surface and opposite sidewalls of the second channel pattern CH2. The gate dielectric pattern GI may cover a top surface of the device isolation layer ST that underlies the gate electrode GE.

In some embodiments, the gate dielectric pattern GI may include a high-k dielectric material whose dielectric constant is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments of the present inventive concepts, the gate dielectric pattern GI may include a ferroelectric material. The gate dielectric pattern GI including the ferroelectric material may serve as a negative capacitor. For example, when the ferroelectric material is supplied with an external voltage, there may be the occurrence of negative capacitance effect caused by phase change, from an initial polarization state to a different polarization state, resulting from migration of dipoles in the ferroelectric material. In this case, a transistor including the ferroelectric material according to the present inventive concepts may have an increased overall capacitance, and accordingly may improve sub-threshold swing characteristics and may reduce operating voltage.

The ferroelectric material of the gate dielectric pattern GI may include hafnium oxide doped with (or containing) one or more of zirconium (Zr), silicon (Si), aluminum (Al), and lanthanum (La). Because hafnium oxide is doped with one or more of zirconium (Zr), silicon (Si), aluminum (Al), and lanthanum (La) at a certain ratio, at least a portion of the ferroelectric material may have an orthorhombic crystal structure. When at least a portion of the ferroelectric material has the orthorhombic crystal structure, the negative capacitance effect may occur. A portion having the orthorhombic crystal structure may have a volume ratio of about 10% to about 50% in the ferroelectric material.

When the ferroelectric material includes zirconium-doped hafnium oxide (ZrHfO), a ratio of Zr atoms to Zr and Hf atoms, or a ratio of Zr/(Hf+Zr), may fall within a range from about 45 at % to about 55 at %. When the ferroelectric material includes silicon-doped hafnium oxide (SiHfO), a ratio of Si atoms to Si and Hf atoms, or a ratio of Si/(Hf+Si), may fall within a range from about 4 at % to about 6 at %. When the ferroelectric material includes aluminum-doped hafnium oxide (AlHfO), a ratio of Al atoms to Al and Hf atoms, or a ratio of Al(Hf+Al), may fall within a range from about 5 at % to about 10 at %. When the ferroelectric material includes lanthanum-doped hafnium oxide (LaHfO), a ratio of La atoms to La and Hf atoms, or a ratio of La/(Hf+La), may fall within a range from about 5 at % to about 10 at %.

The gate electrode GE may include a first metal pattern WF1, a second metal pattern WF2, a first barrier pattern WF3, a second barrier pattern WF4, and an electrode pattern EL that are sequentially stacked.

The first metal pattern WF1 may be provided on the gate dielectric pattern GI. For example, the gate dielectric pattern GI may be interposed between the first metal pattern WF1 and the first channel pattern CH1 and between the first metal pattern WF1 and the second channel pattern CH2. The first metal pattern WF1 may have a thickness T1 ranging from about 2 nm to about 5 nm (see FIG. 2E). The first metal pattern WF1 may have an upper portion adjacent to the gate spacer GS, and the thickness T1 may correspond to a width in the second direction D2 of the upper portion of the first metal pattern WF1.

Referring back to FIGS. 2A and 2B, the gate dielectric pattern GI and the first metal pattern WF1 may be chamfered at their upper portions, such that the chamfered upper portions may be lower than an uppermost top surface GEt of the gate electrode GE. For example, the first metal pattern WF1 may have a recessed top surface RSt, and the recessed top surface RSt may be lower than the uppermost top surface GEt of the gate electrode GE. Accordingly, the phrase "recessed top surface," as used herein, refers to the uppermost surface of the first metal pattern WF1 (e.g., the top surface of a vertically-protruding portion thereof) being lower than the uppermost top surface GEt. The uppermost surface of the first metal pattern WF1 does not, however, necessarily have a recess therein. Rather, the uppermost surface of the first metal pattern WF1 may be a flat or curved surface that is free of a recess. The first metal pattern WF1 may be thicker on the first region PR than on the second region NR.

The first metal pattern WF1 may include a metal nitride layer whose work function is relatively high. For example, the first metal pattern WF1 may include a p-type work function metal. The first metal pattern WF1 may include, for example, a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer.

The first metal pattern WF1 may be thicker on the first region PR than on the second region NR. Because the first region PR is a PMOSFET area, the p-type work function metal may be relatively thick. Because the second region NR is an NMOSFET area, the p-type work function metal may be relatively thin.

The second metal pattern WF2 may be provided on the first metal pattern WF1. The second metal pattern WF2 may cover the recessed top surface RSt of the first metal pattern WF1 (see FIGS. 2A and 2B). The second metal pattern WF2 may have a thickness T2 ranging from about 3 nm to about 5 nm (see FIG. 2E). The second metal pattern WF2 may have an upper portion adjacent to the gate spacer GS, and the thickness T2 may correspond to a width in the second direction D2 of the upper portion of the second metal pattern WF2.

The second metal pattern WF2 may include metal carbide whose work function is relatively low. For example, the second metal pattern WF2 may include an n-type work function metal. The second metal pattern WF2 may include metal carbide doped with (or containing) silicon and/or aluminum. The second metal pattern WF2 may include, for example, aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). Alternatively, the second metal pattern WF2 may include aluminum-silicon-doped titanium carbide (TiAlSiC) or aluminum-silicon-doped tantalum carbide (TaAlSiC). As another example, the second metal pattern WF2 may include aluminum-doped titanium (TiAl).

The work function of the second metal pattern WF2 may be adjusted by controlling a concentration of dopants such as silicon or aluminum. For example, impurities (e.g., silicon or aluminum) contained in the first metal pattern WF1 may have a concentration ranging from about 0.1 at % to about 25 at %.

The first and second metal patterns WF1 and WF2 may be adjacent to the channel patterns CH1 and CH2. The first and second metal patterns WF1 and WF2 may serve as work function metals that control threshold voltages of transistors. For example, a desired threshold voltage may be achieved by controlling thickness and composition of each of the first and second metal patterns WF1 and WF2.

The first barrier pattern WF3 may be provided on the second metal pattern WF2. The first barrier pattern WF3 may be conformally formed on the second metal pattern WF2. The first barrier pattern WF3 may have a thickness T3 less than the thickness T2 of the second metal pattern WF2. The thickness T3 of the first barrier pattern WF3 may range from about 1 nm to about 5 nm (see FIG. 2E). The first barrier pattern WF3 may have an upper portion adjacent to the gate spacer GS, and the thickness T3 may correspond to a width in the second direction D2 of the upper portion of the first barrier pattern WF3.

Referring back to FIG. 2C, the first barrier pattern WF3 may be interposed between the first channel patterns CH1 that are adjacent to each other in the first direction D1. The first barrier pattern WF3 may also be interposed between the second channel patterns CH2 that are adjacent to each other in the first direction D1.

The first barrier pattern WF3 may include a p-type work function metal whose work function is relatively high. The first barrier pattern WF3 may include an amorphous metal layer. For example, the first barrier pattern WF3 may include tungsten (W), carbon (C), and nitrogen (N). The first barrier pattern WF3 may include an amorphous tungsten carbon nitride (WCN) layer. The WCN layer of the first barrier pattern WF3 may be a tungsten layer containing carbon and nitrogen as impurities. For example, an atomic percent of tungsten contained in the first barrier pattern WF3 may be greater than that of each of carbon and nitrogen contained in the first barrier pattern WF3.

The first barrier pattern WF3 may further include an additional metal element that is diffused inwardly from adjacent metal layers. For example, the first barrier pattern WF3 may further include titanium (Ti) in addition to tungsten (W), carbon (C), and nitrogen (N). The first barrier pattern WF3 may include a metal element, such as titanium (Ti), whose content is extremely small (e.g., about 5 at % or less).

For another example, the first barrier pattern WF3 may include an amorphous metal layer, such as a titanium aluminum nitride (TiAlN) layer, a titanium silicon nitride (TiSiN) layer, a titanium oxynitride (TiON) layer, or a tantalum nitride (TaN) layer.

The second barrier pattern WF4 may be provided on the first barrier pattern WF3. Among the patterns WF1 to WF4, the second barrier pattern WF4 may be thicker than any other pattern. The second barrier pattern WF4 may have a thickness T4 ranging from about 5 nm to about 70 nm (see FIG. 2E). The second barrier pattern WF4 may have an upper portion adjacent to the gate spacer GS, and the thickness T4 may correspond to a width in the second direction D2 of the upper portion of the second barrier pattern WF4.

Referring again to FIG. 2C, the second barrier pattern WF4 may be in (e.g., may completely fill) a space between the first channel patterns CH1 that are adjacent to each other in the first direction D1. The second barrier pattern WF4 may be in (e.g., may completely fill) a space between the second channel patterns CH2 that are adjacent to each other in the first direction D1.

The second barrier pattern WF4 may include a metal nitride layer whose work function is relatively high. For example, the second barrier pattern WF4 may include a p-type work function metal. The second barrier pattern WF4 may include, for example, a titanium nitride (TiN) layer, a tantalum nitride (TaN) layer, or a titanium oxynitride (TiON) layer. The second barrier pattern WF4 may include the same material as that of the first metal pattern WF1.

The second barrier pattern WF4 may include a crystalline metal nitride layer. For example, the second barrier pattern WF4 may include crystal grains. The second barrier pattern WF4 may include a grain boundary between the crystal grains.

Referring still to FIG. 2C, the gate dielectric pattern GI and the patterns WF1 to WF4 may be in (e.g., may fill) a space SA between the first channel patterns CH1 that are adjacent to each other in the first direction D1. In some embodiments, when a distance in the first direction D1 between the first channel patterns CH1 is less than that illustrated in FIG. 2C, the second barrier pattern WF4 may not be in (e.g., may not fill) the space SA.

The electrode pattern EL may be provided on the second barrier pattern WF4. The electrode pattern EL may have a lower resistance than those of the patterns WF1 to WF4. For example, the electrode pattern EL may include at least one low-resistance metal selected from aluminum (Al), tungsten (W), titanium (Ti), and tantalum (Ta).

The first barrier pattern WF3 and the second barrier pattern WF4 may inhibit/prevent the metal of the electrode pattern EL from diffusing into the first and second metal patterns WF1 and WF2. For example, because the second barrier pattern WF4 is formed relatively thick, the metal of the electrode pattern EL may be effectively inhibited/prevented from diffusing into the first and second metal patterns WF1 and WF2.

According to some embodiments of the present inventive concepts, because the first barrier pattern WF3 includes the amorphous WCN layer, the first barrier pattern WF3 may have no grain boundary and thus may inhibit/prevent the diffusion of materials. For example, when the electrode pattern EL is deposited, fluorine (F) may diffuse into the second metal pattern WF2 through the grain boundary of the second barrier pattern WF4, which diffusion may cause issues associated with a reduction in effective work function (eWF) of the gate electrode GE. On the other hand, the first barrier pattern WF3 according to some embodiments of the present inventive concepts may be interposed between the second metal pattern WF2 and the second barrier pattern WF4, and thus fluorine (F) may be inhibited/prevented from diffusing into the second metal pattern WF2. It may thus be possible to increase effective work functions of gate electrodes and to achieve desired threshold voltages of transistors.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 covering the gate capping patterns GP. For example, the first and second interlayer dielectric layers 110 and 120 may include a silicon oxide layer.

A pair of gate electrodes GE may be provided therebetween with one or more active contacts AC that penetrate the first and second interlayer dielectric layers 110 and 120 and have electrical connection with the first and second source/drain patterns SD1 and SD2. The active contact AC may include at least one metallic material selected from, for example, aluminum, copper, tungsten, molybdenum, and cobalt.

The active contact AC may be a self-aligned contact. For example, the gate capping pattern GP and the gate spacer GS may be used to form the active contact AC in a self-aligned manner. The active contact AC may cover a sidewall of the gate spacer GS. A portion of the active contact AC may cover a top surface of the gate capping pattern GP.

A silicide layer may be interposed between the active contact AC and the first source/drain pattern SD1 and between the active contact AC and the second source/drain pattern SD2. The active contacts AC may be electrically connected through the silicide layers to the first and second source/drain patterns SD1 and SD2. The silicide layer may include metal silicide, for example, one or more of titanium silicide, tantalum silicide, tungsten silicide, nickel silicide, and cobalt silicide.

The device isolation layer ST may be provided thereon with at least one gate contact GC that penetrates the second interlayer dielectric layer 120 and the gate capping pattern GP and has electrical connection with the gate electrode GE. The gate contact GC may include the same metallic material as that of the active contact AC.

A barrier layer may be provided to cover each of the active contact AC and the gate contact GC. The barrier layer may cover a bottom surface and sidewalls of the active contact AC. The barrier layer may cover a bottom surface and sidewalls of the gate contact GC. The barrier layer may include one or more of a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Figure 6A:
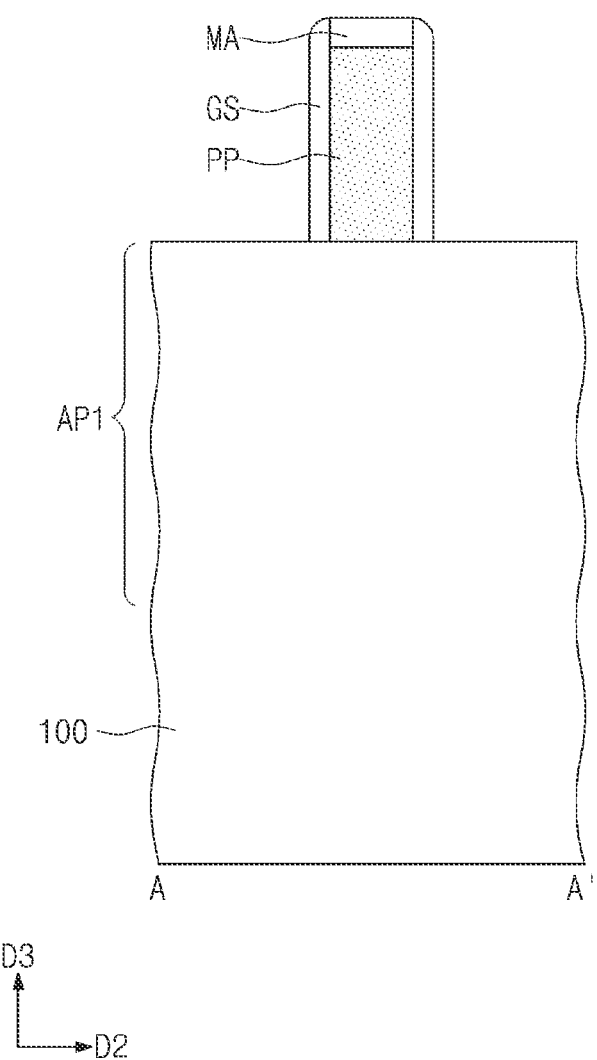
Figure 6B:
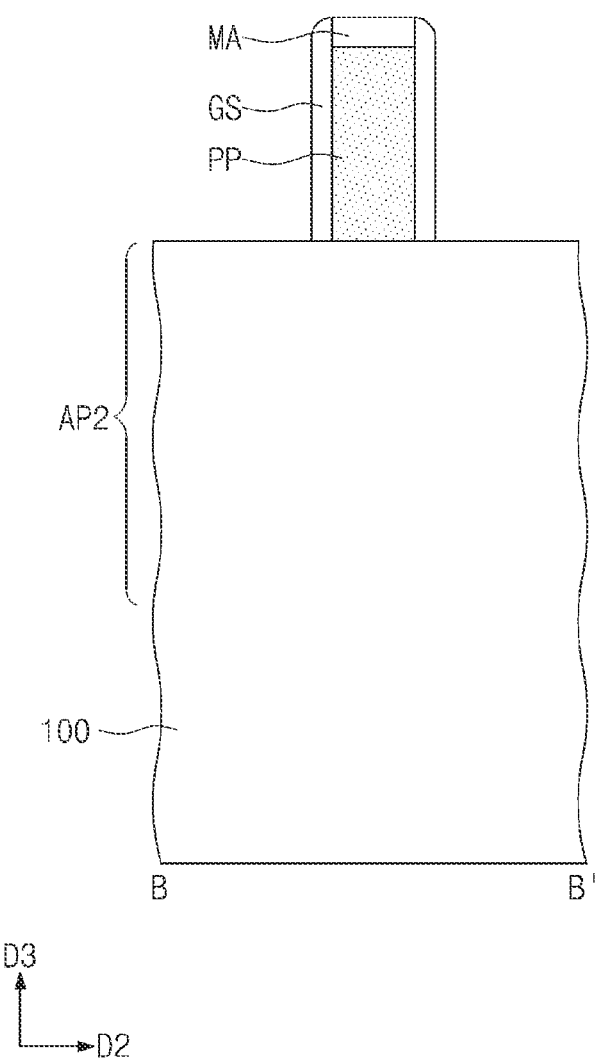
FIGS. 6B, 8B, and 10B illustrate cross-sectional views taken along line B-B' of FIGS. 5, 7, and 9, respectively.
Figure 6C:
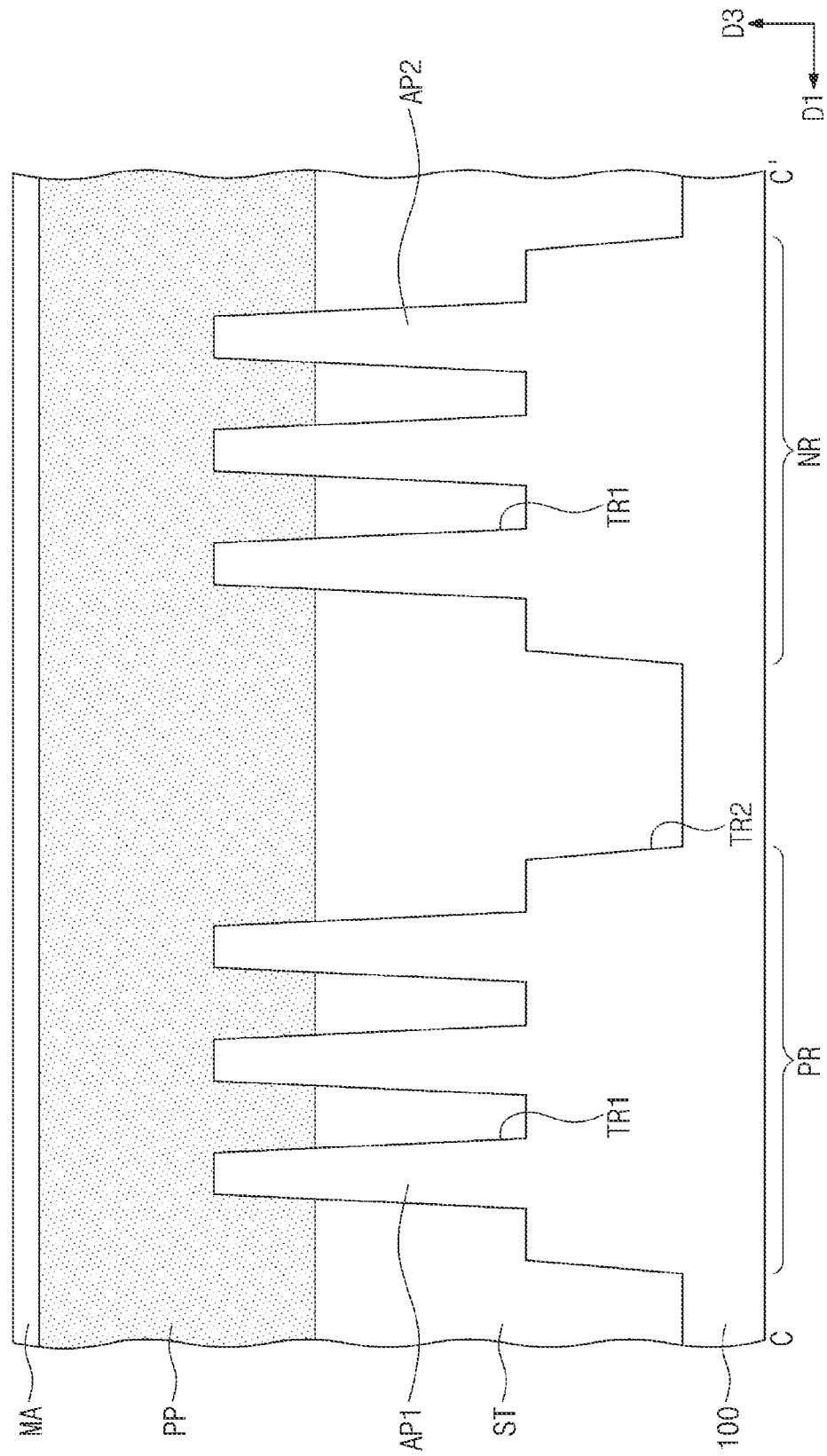
FIGS. 6C, 8C, and 10C illustrate cross-sectional views taken along line C-C' of FIGS. 5, 7, and 9, respectively.
Figure 6D:
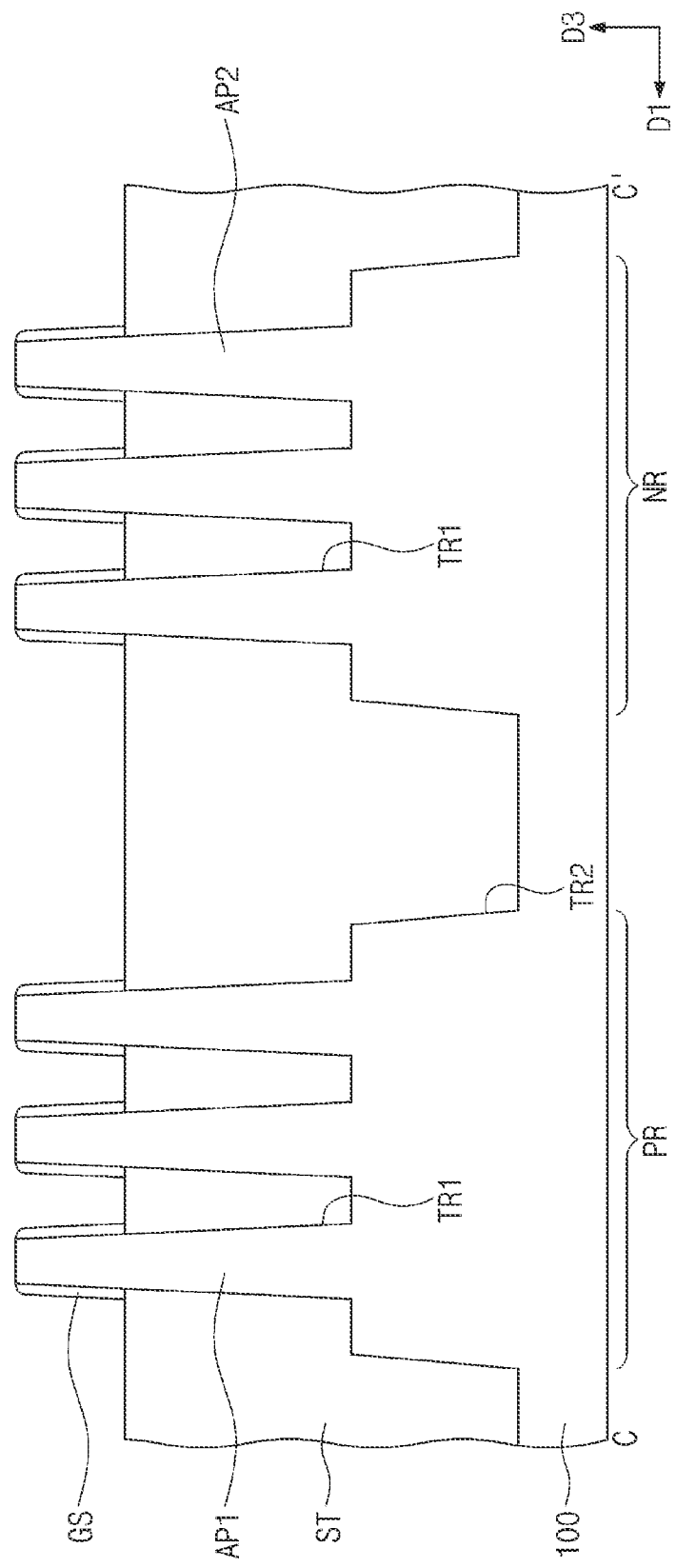
FIGS. 6D, 8D, and 10D illustrate cross-sectional views taken along line D-D' of FIGS. 5, 7, and 9, respectively.
Figure 7:
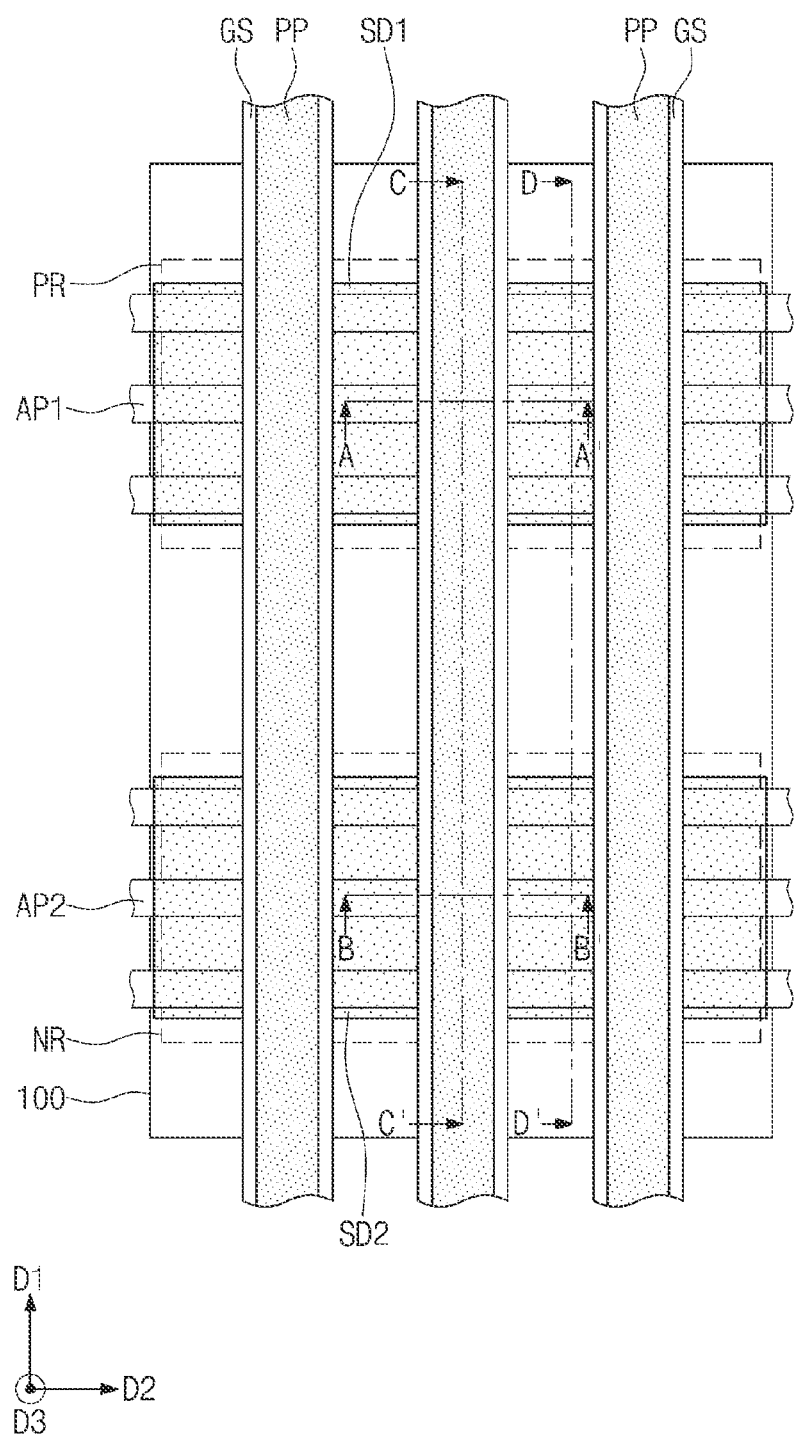
Figure 8A:
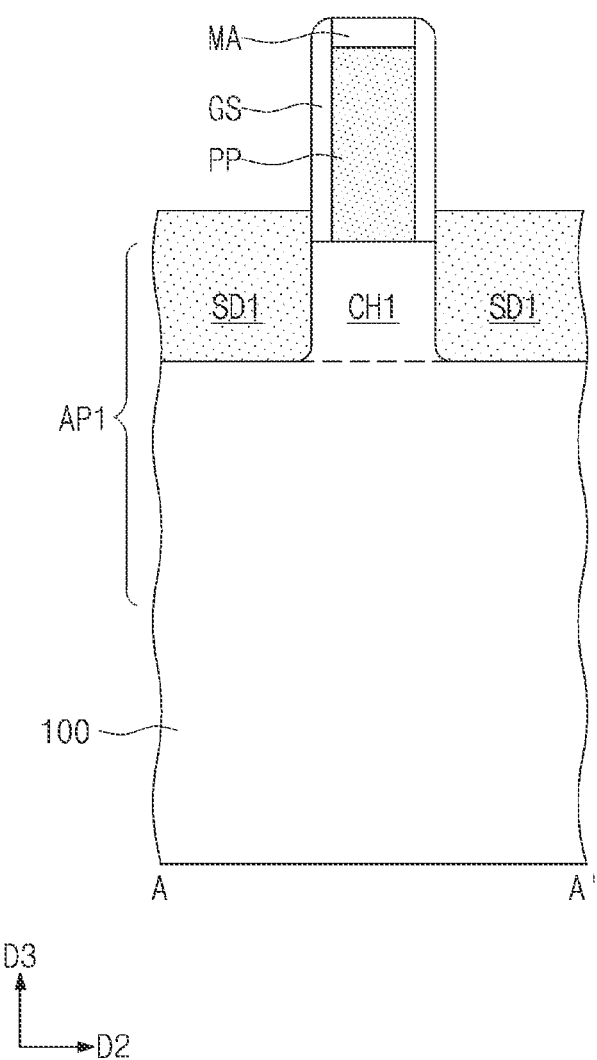
Figure 8B:
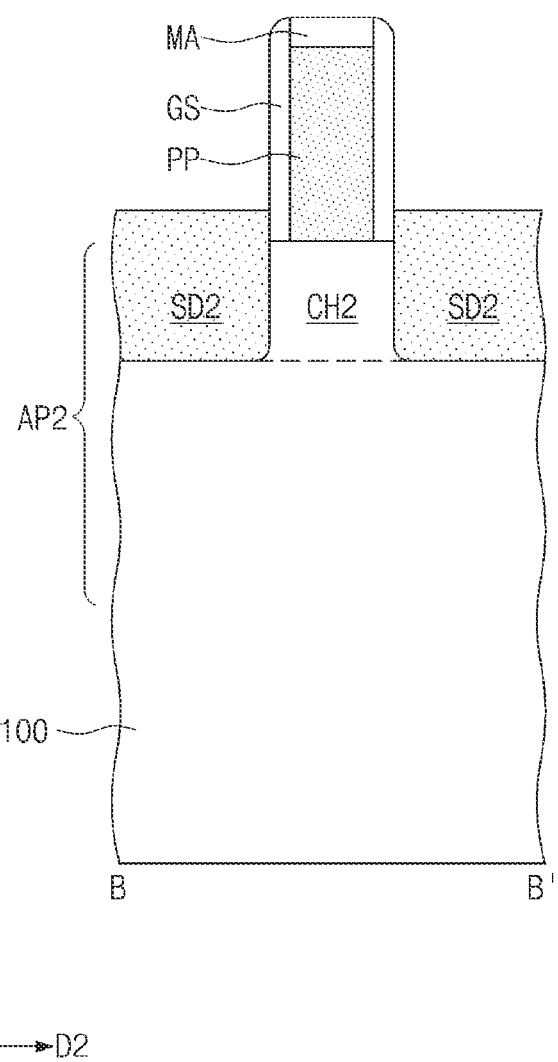
Figure 8C:
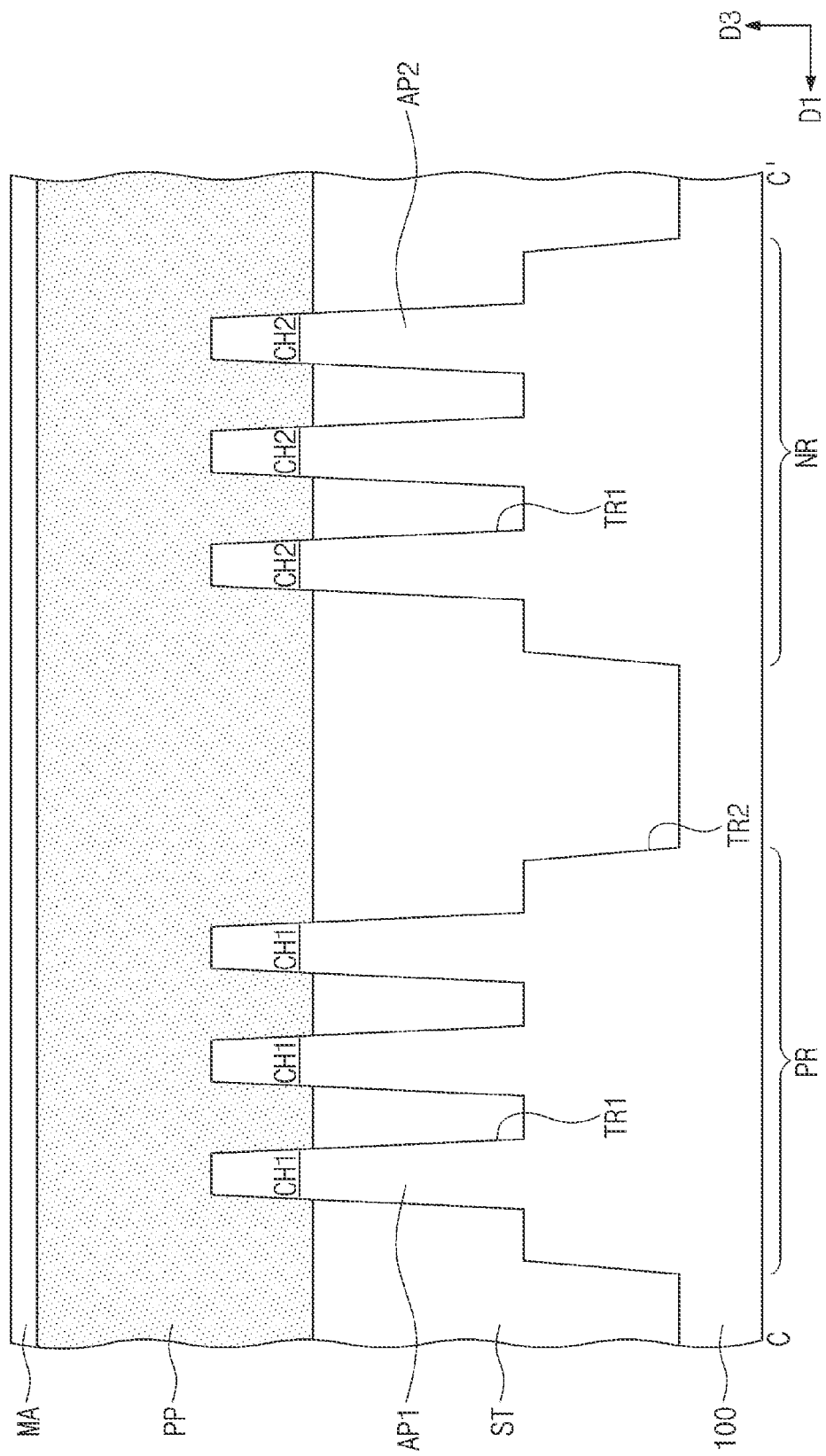
Figure 8D:
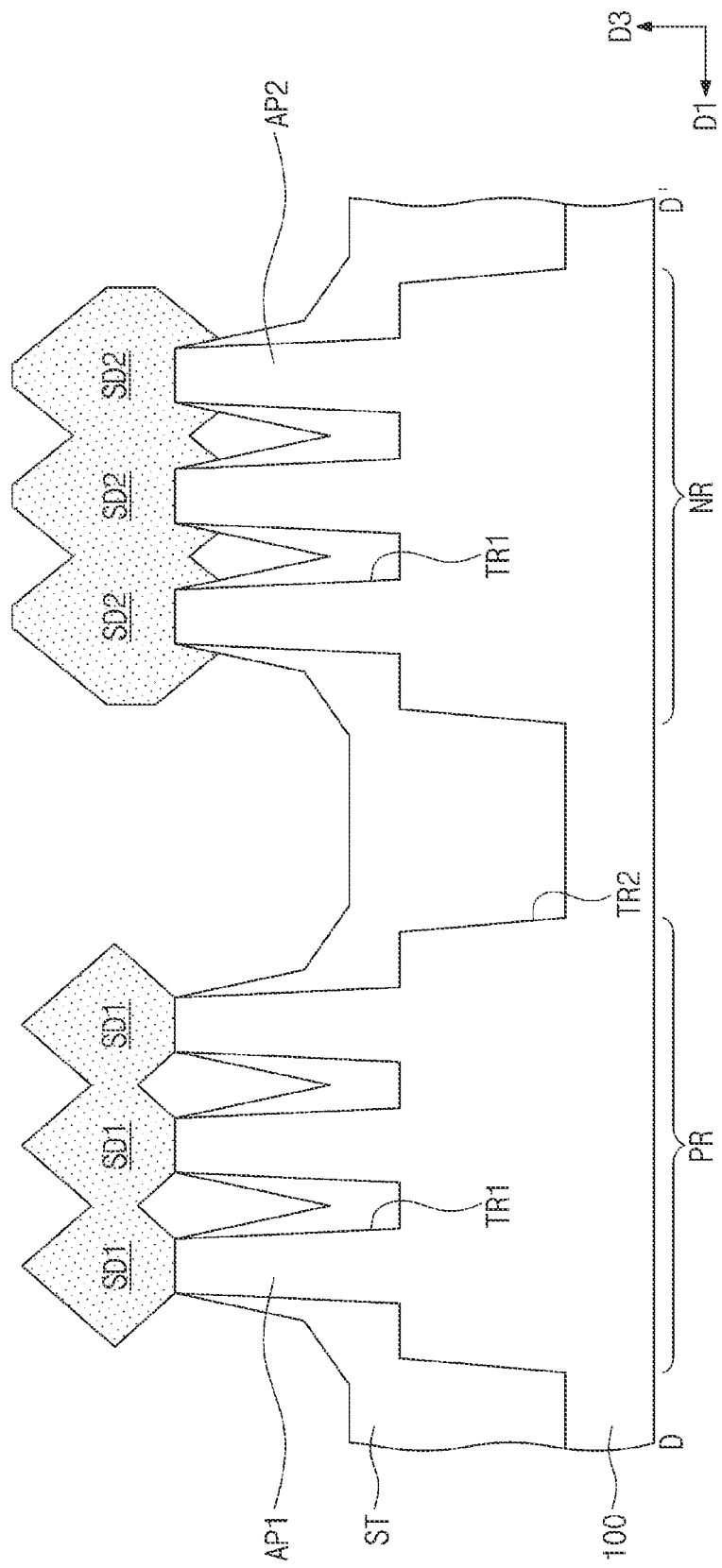
Figure 9:
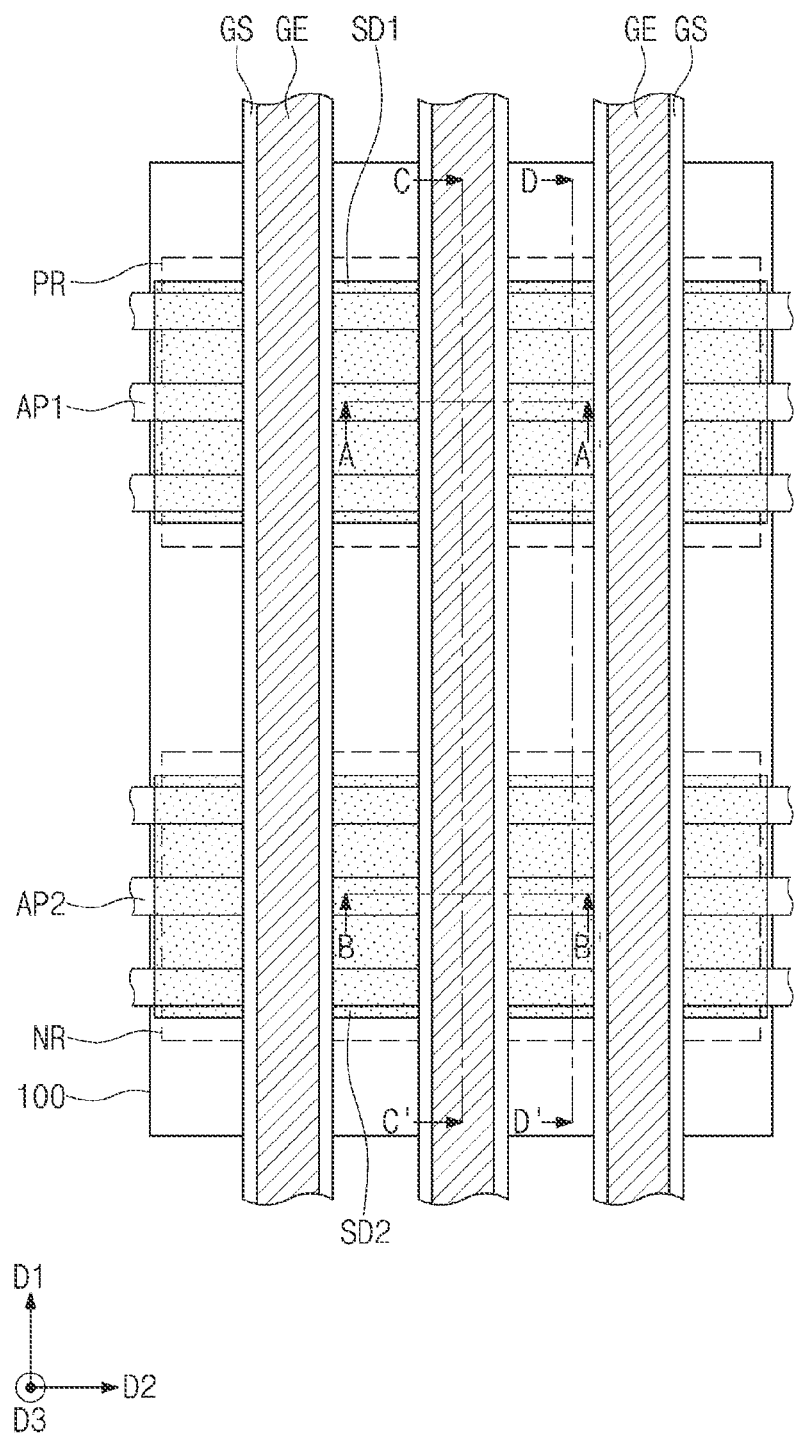
Figure 10A:
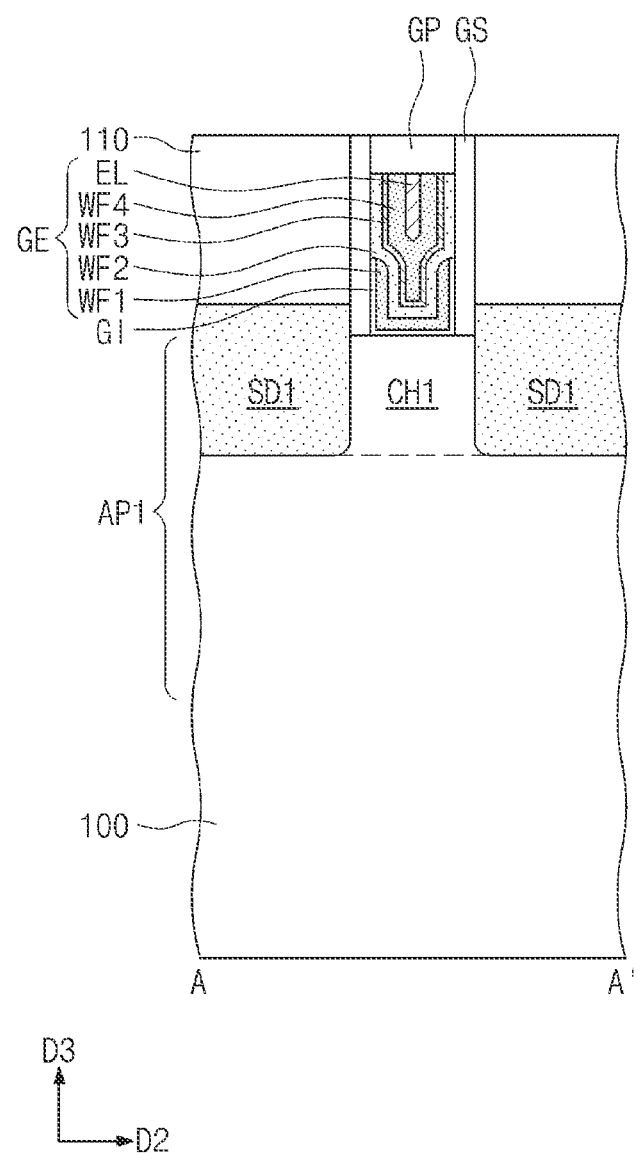
Figure 10B:
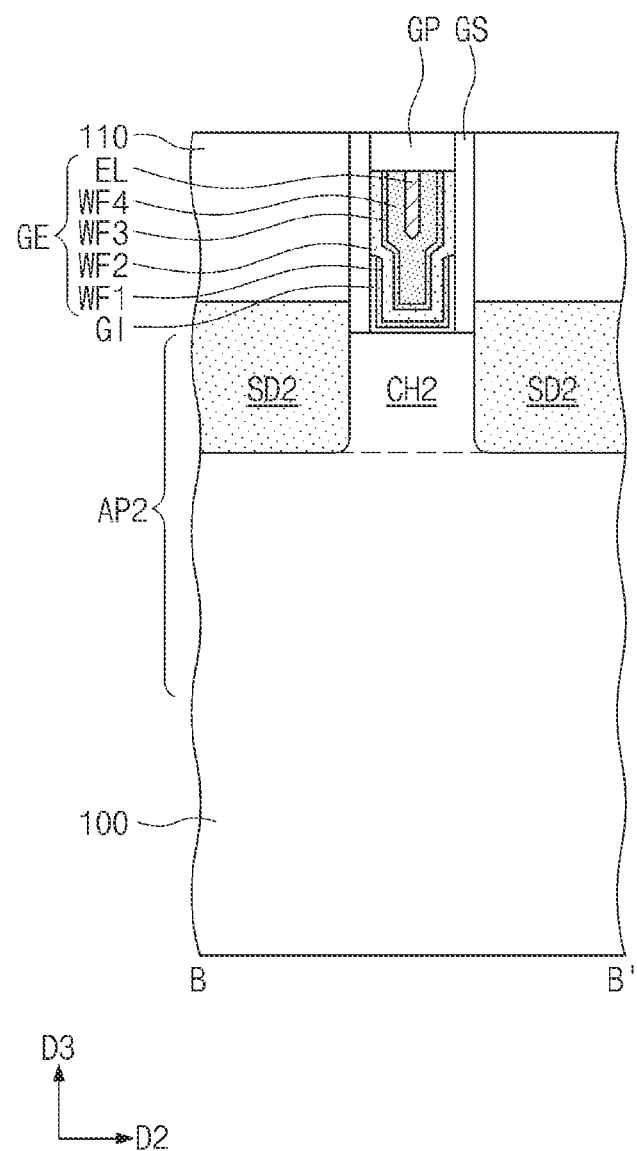
Figure 10C:
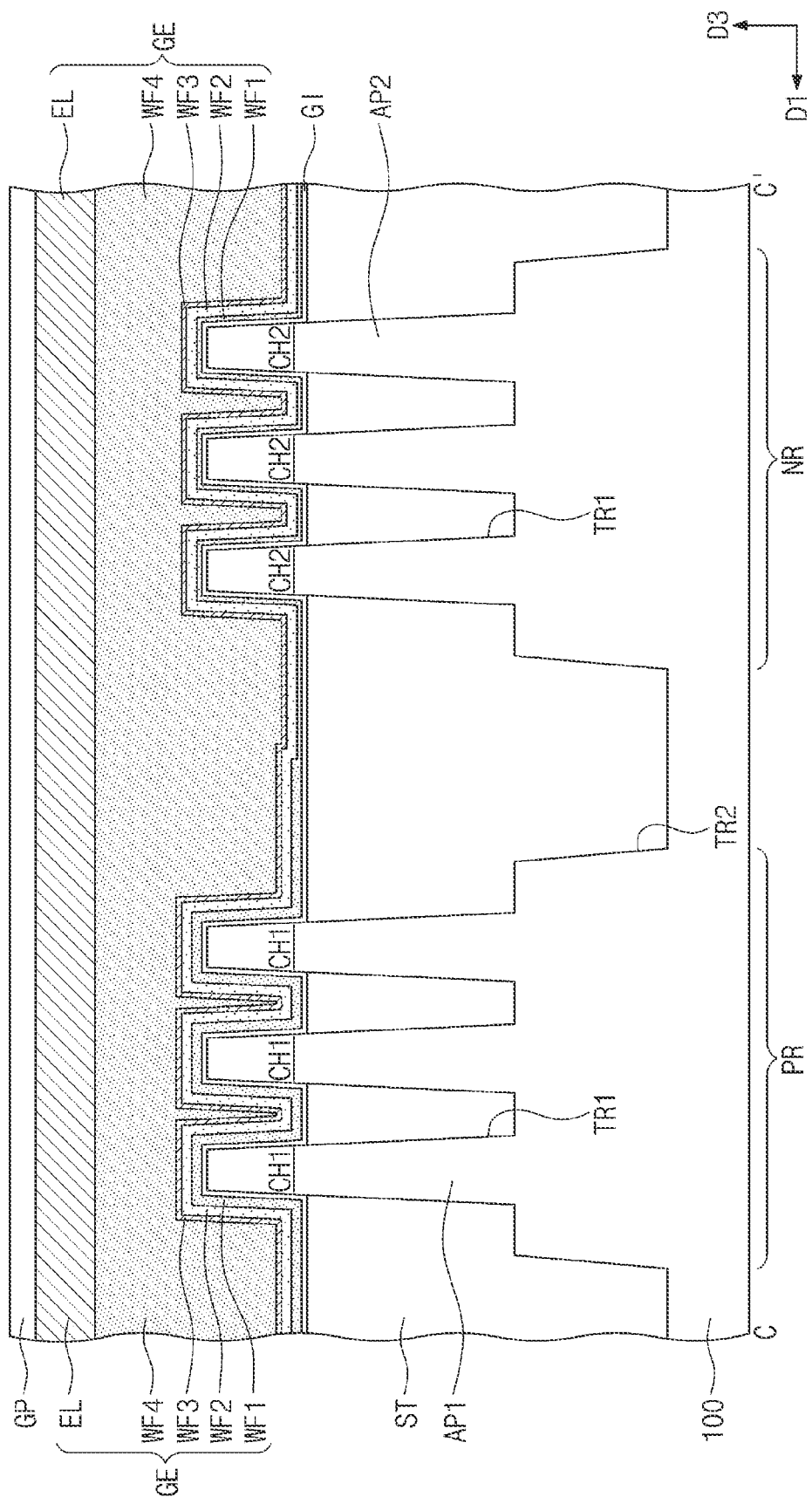
Figure 10D:
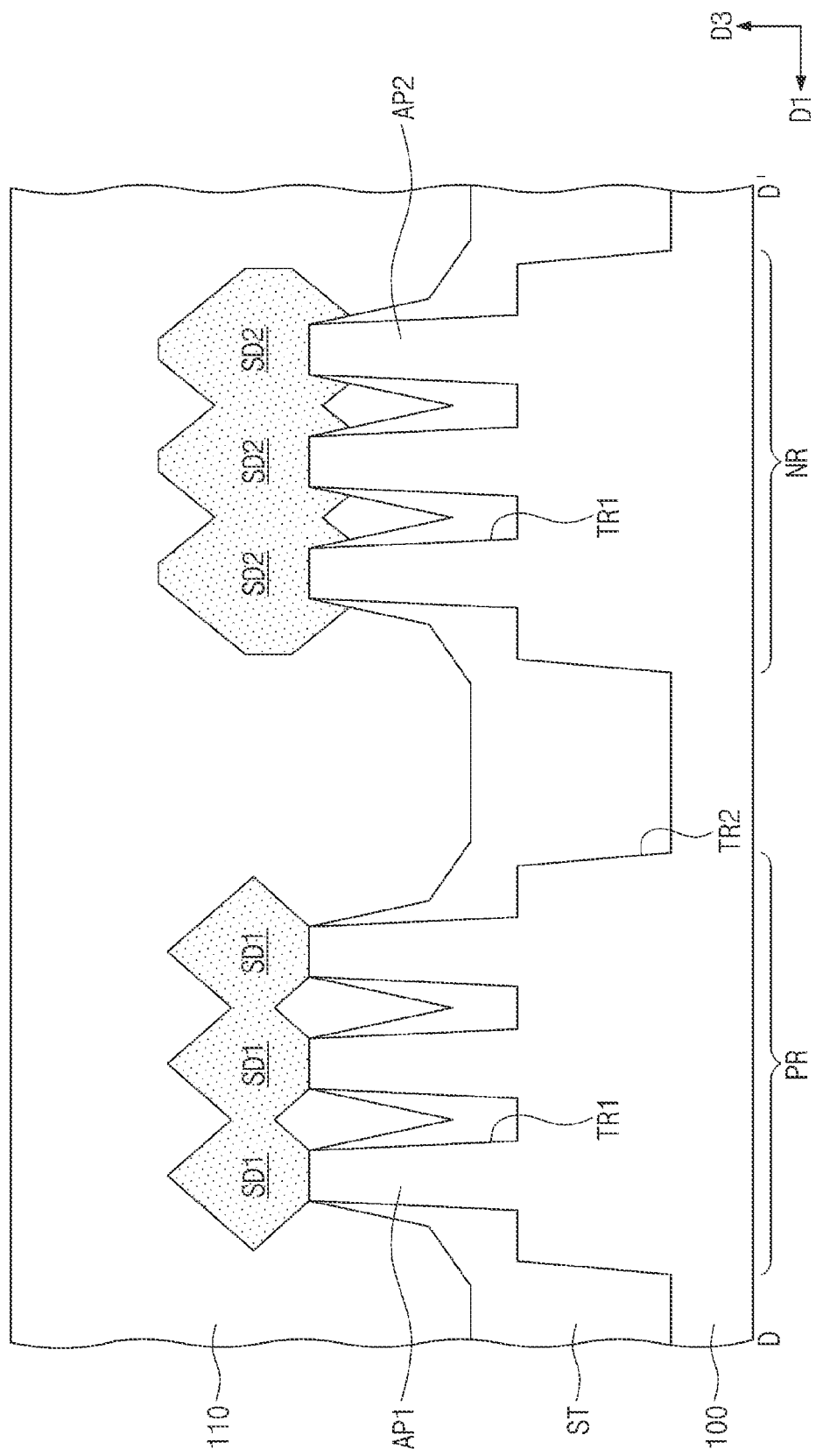
Figure 11:
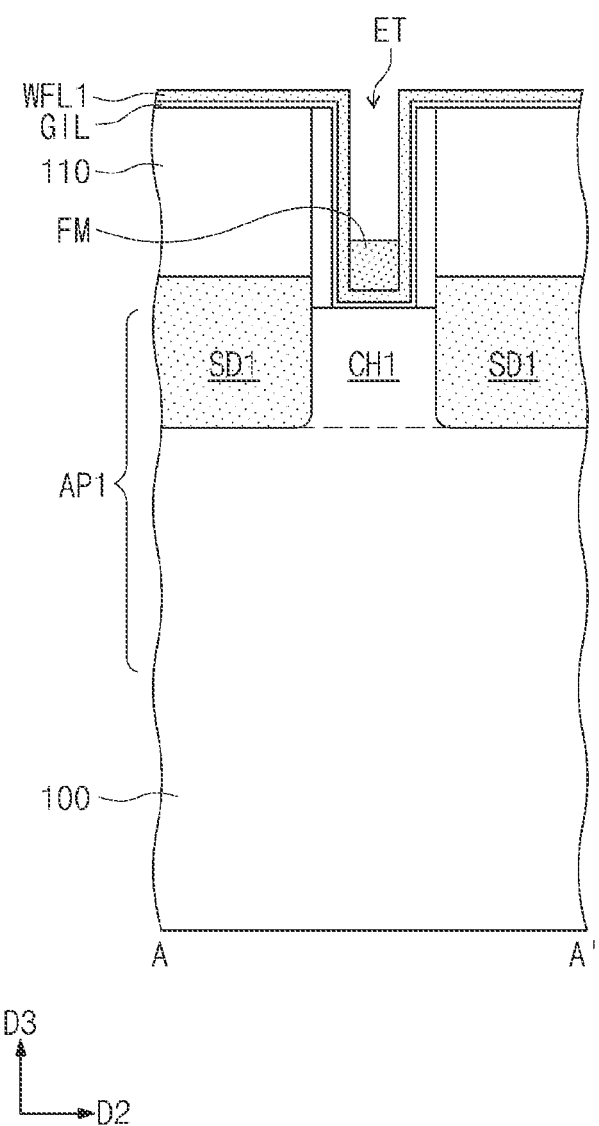
FIGS. 11, 12, and 13 illustrate cross-sectional views taken along line A-A' of FIG. 9, showing a method of forming a gate dielectric pattern and a gate electrode.
Figure 12:
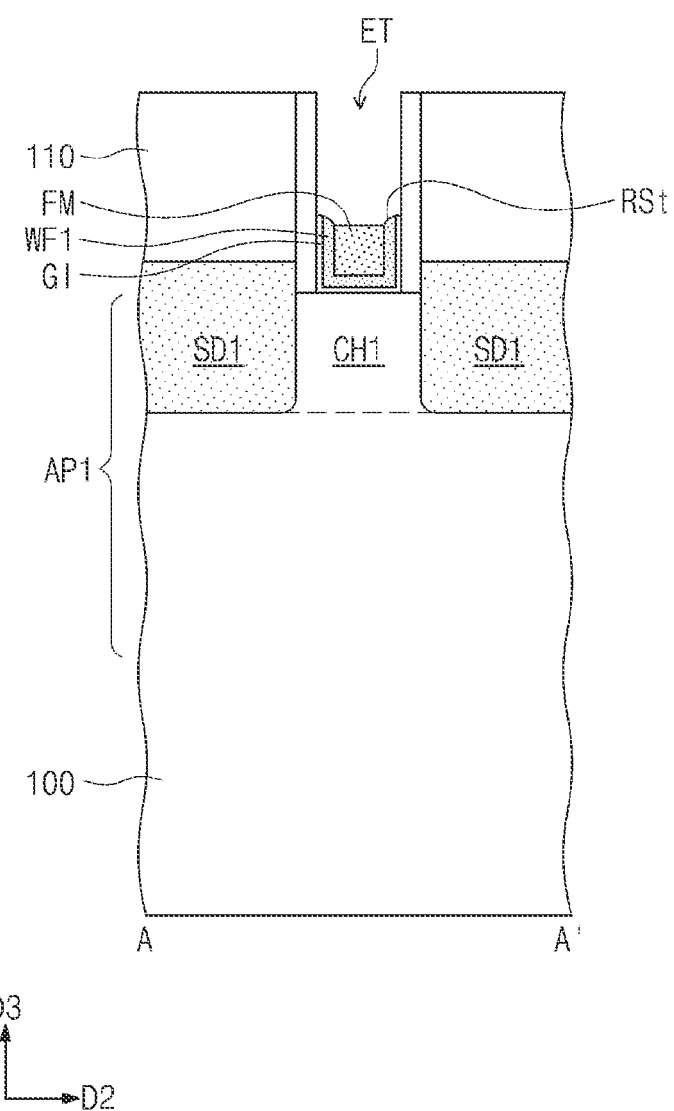
Figure 13:
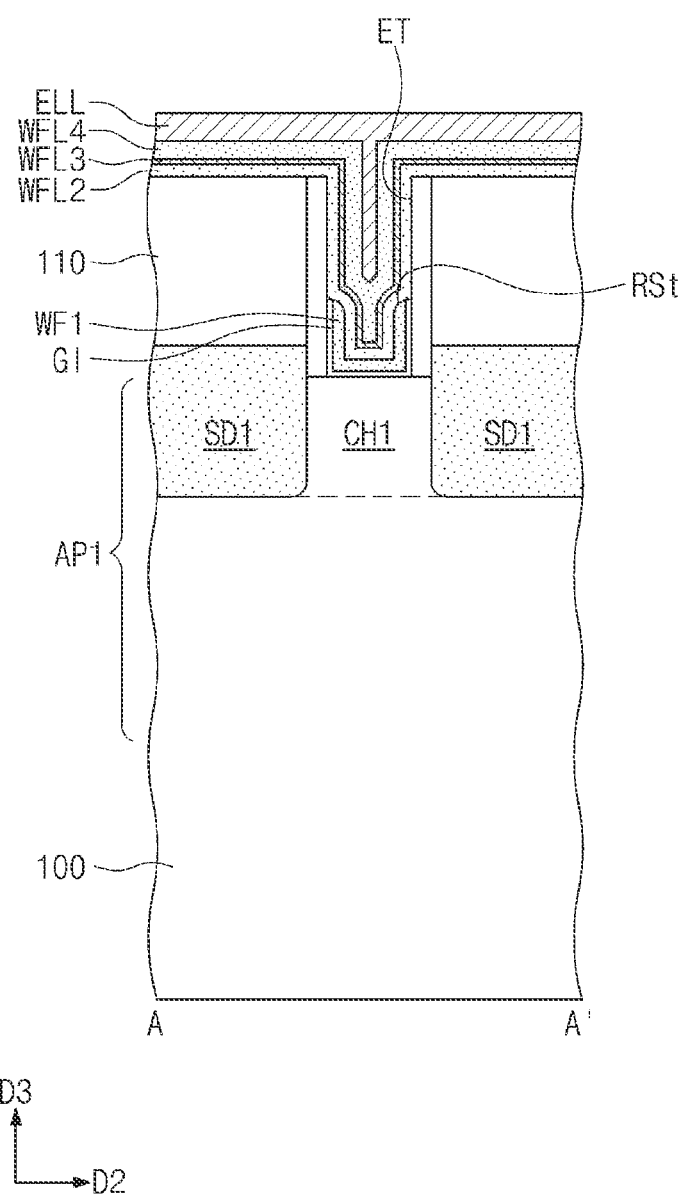

FIGS. 3, 5, 7, and 9 illustrate plan views showing a method of fabricating a semiconductor device according to some example embodiments of the present inventive concepts. FIGS. 4, 6A, 8A, and 10A illustrate cross-sectional views taken along line A-A' of FIGS. 3, 5, 7, and 9, respectively. FIGS. 6B, 8B, and 10B illustrate cross-sectional views taken along line B-B' of FIGS. 5, 7, and 9, respectively. FIGS. 6C, 8C, and 10C illustrate cross-sectional views taken along line C-C' of FIGS. 5, 7, and 9, respectively. FIGS. 6D, 8D, and 10D illustrate cross-sectional views taken along line D-D' of FIGS. 5, 7, and 9, respectively. FIGS. 11, 12, and 13 illustrate cross-sectional views taken along line A-A' of FIG. 9, showing a method of forming a gate dielectric pattern and a gate electrode.

Figure 3:
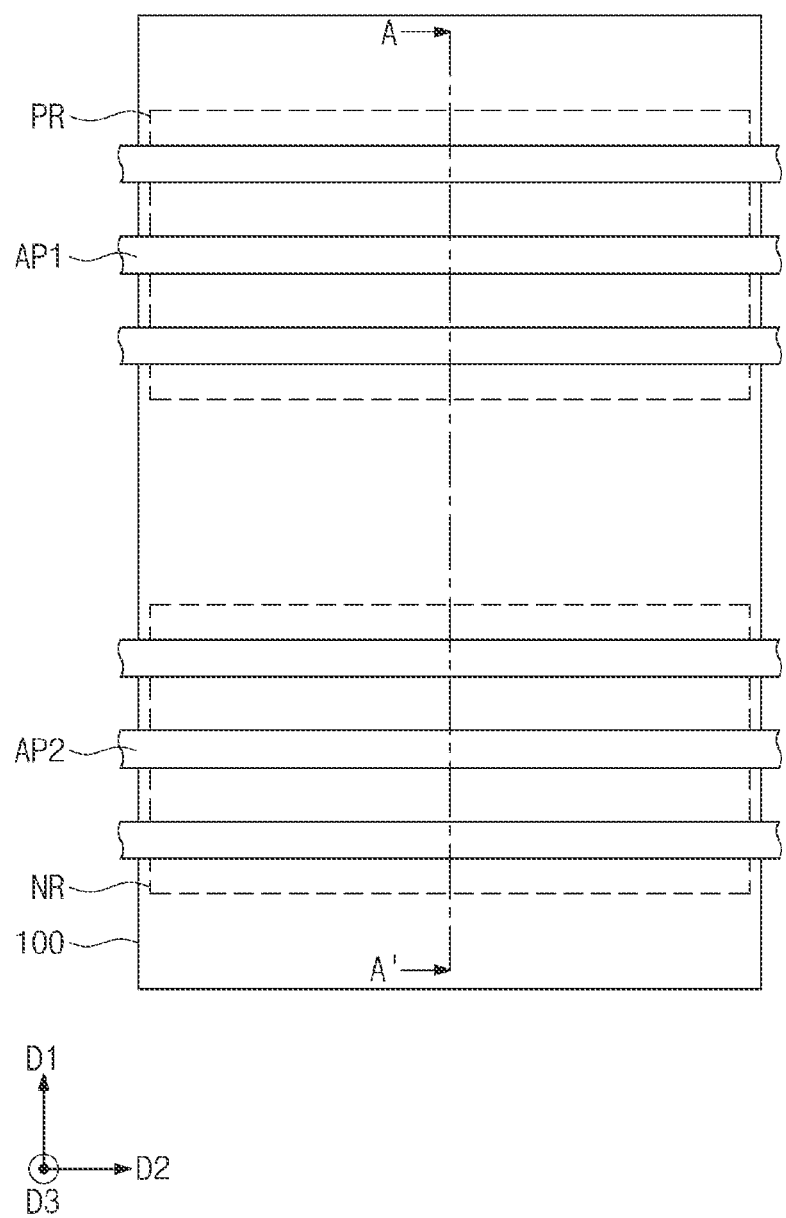
FIGS. 3, 5, 7, and 9 illustrate plan views showing a method of fabricating a semiconductor device according to some example embodiments of the present inventive concepts.
Figure 4:
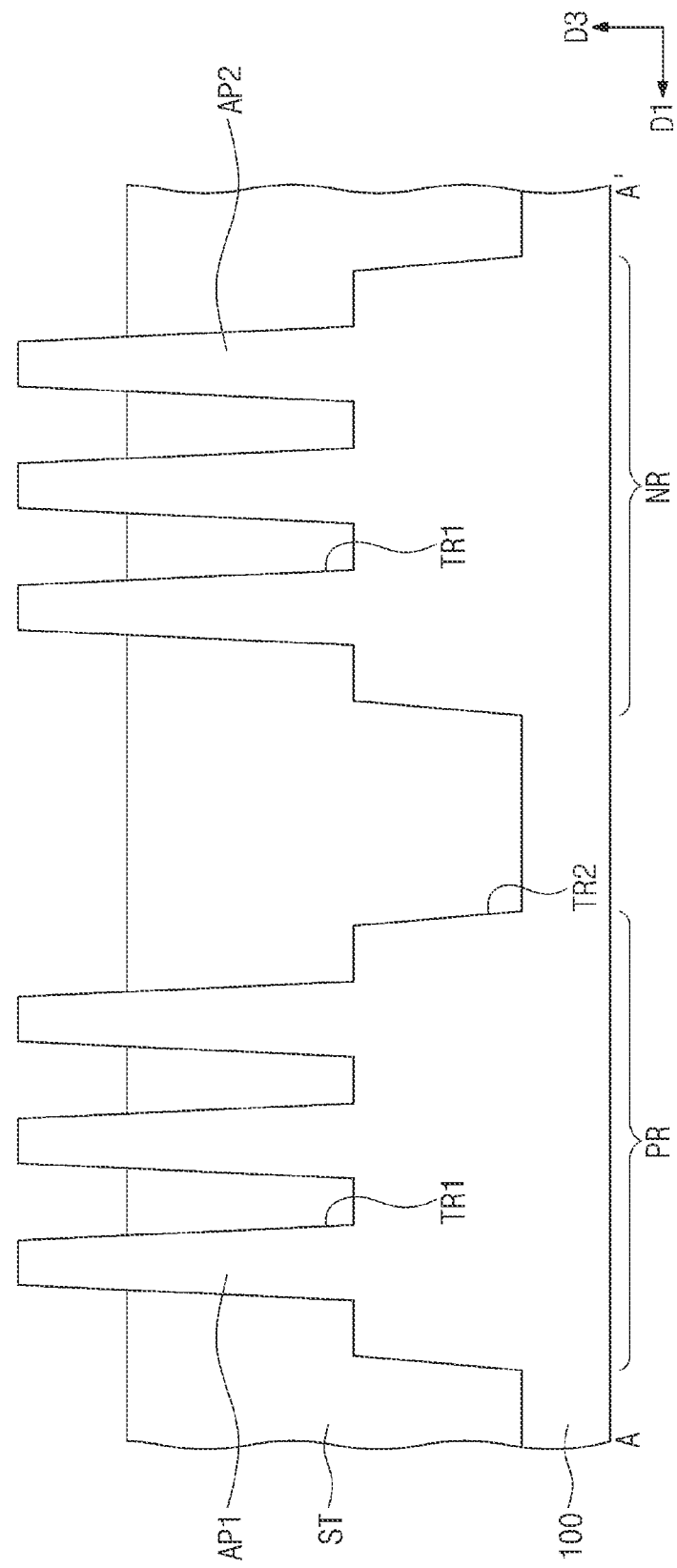
FIGS. 4, 6A, 8A, and 10A illustrate cross-sectional views taken along line A-A' of FIGS. 3, 5, 7, and 9, respectively.
Figure 5:
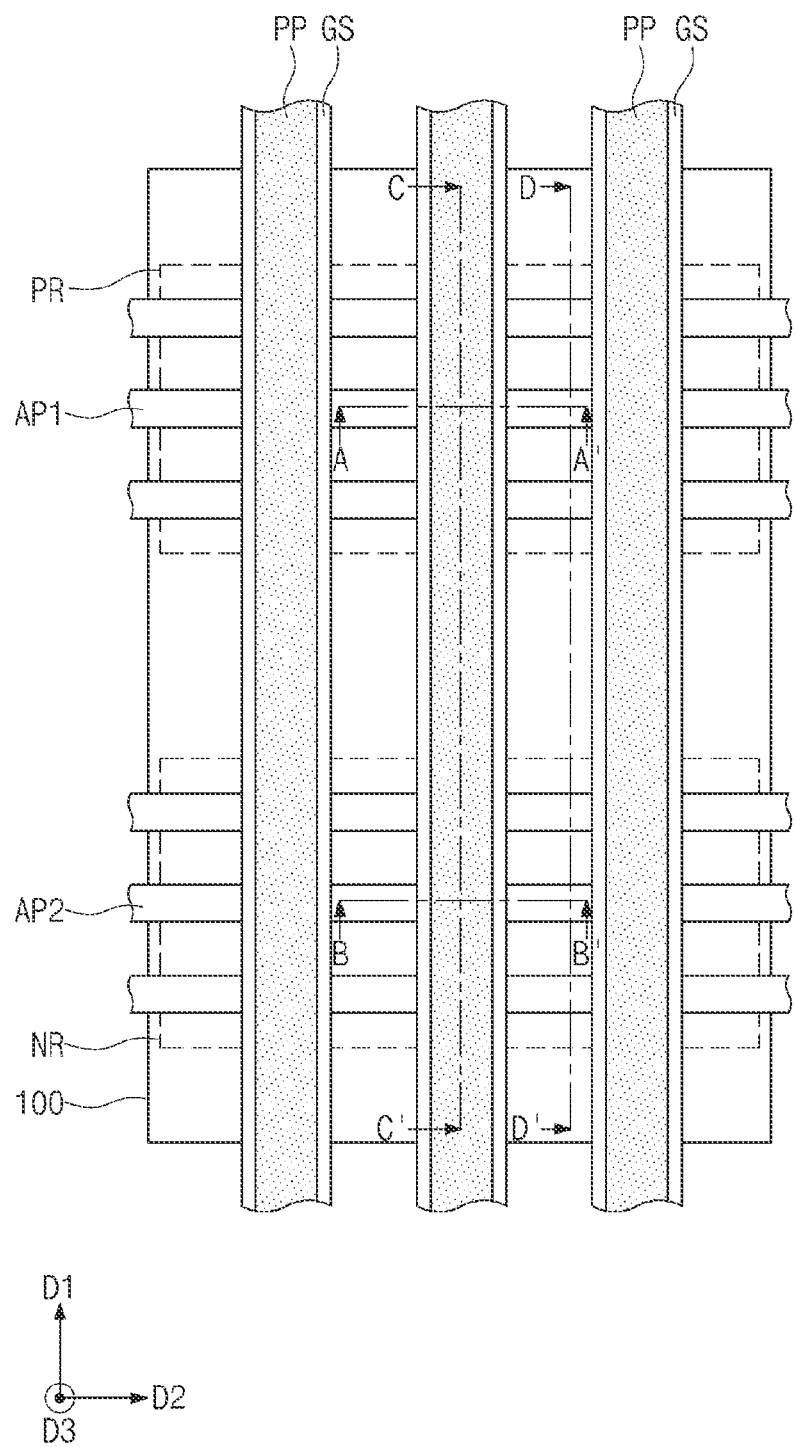

Referring to FIGS. 3 and 4, a substrate 100 may be provided to include a first region PR and a second region NR. The substrate 100 may be patterned to form first and second active patterns AP1 and AP2. The first active patterns AP1 may be formed on the first region PR, and the second active patterns AP2 may be formed on the second region NR. A first trench TR1 may be formed between the first active patterns AP1 and between the second active patterns AP2.

The substrate 100 may be patterned to form a second trench TR2 between the first region PR and the second region NR. The second trench TR2 may be formed deeper than the first trench TR1.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first and second active patterns AP1 and AP2 are exposed. Thus, the upper portions of the first and second active patterns AP1 and AP2 may vertically protrude beyond the device isolation layer ST.

Referring to FIGS. 5 and 6A to 6D, sacrificial patterns PP may be formed to run across the first and second active patterns AP1 and AP2. Each of the sacrificial patterns PP may be formed to have a linear or bar shape extending in a first direction D1. For example, the formation of the sacrificial patterns PP may include forming a sacrificial layer on an entire surface of the substrate 100, forming hardmask patterns MA on the sacrificial layer, and etching the sacrificial layer by using the hardmask patterns MA as an etching mask. The sacrificial layer may include a polysilicon layer.

A pair of gate spacers GS may be formed on opposite sidewalls of each of the sacrificial patterns PP. The gate spacers GS may also be formed on opposite sidewalls of each of the first and second active patterns AP1 and AP2. The opposite sidewalls of each of the first and second active patterns AP1 and AP2 may be exposed portions that are not covered with the device isolation layer ST and the sacrificial patterns PP.

The formation of the gate spacers GS may include conformally forming a gate spacer layer on an entire exposed surface of the substrate 100 and anisotropically etching the gate spacer layer. The gate spacer layer may include one or more of SiCN, SiCON, and SiN. Alternatively, the gate spacer layer may be a multi-layer structure including two or more of SiCN, SiCON, and SiN.

Referring to FIGS. 7 and 8A to 8D, first source/drain patterns SD1 may be formed on the upper portion of each of the first active patterns AP1. A pair of first source/drain patterns SD1 may be formed on opposite sides of each of the sacrificial patterns PP.

For example, the hardmask patterns MA and the gate spacers GS may be used as an etching mask to etch the upper portions of the first active patterns AP1, which may result in the formation of first recesses. While the upper portions of the first active patterns AP1 are etched, the gate spacers GS may also be removed from the opposite sidewalls of each of the first active patterns AP1. While the upper portions of the first active patterns AP1 are etched, the device isolation layer ST may be recessed between the first active patterns AP1.

The first recesses of the first active patterns AP1 may have their inner sidewalls that serve as seed layers used for a selective epitaxial growth process to form the first source/drain patterns SD1. The formation of the first source/drain patterns SD1 may define a first channel pattern CH1 between a pair of first source/drain patterns SD1. For example, the selective epitaxial growth process may include a chemical vapor deposition (CVD) process or a molecular beam epitaxy (MBE) process. The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ implanted during the selective epitaxial growth process for the formation of the first source/drain patterns SD1. For another example, after the formation of the first source/drain patterns SD1, impurities may be implanted into the first source/drain patterns SD1. The first source/drain patterns SD1 may be doped to have a first conductivity type (e.g., p-type).

Second source/drain patterns SD2 may be formed on the upper portion of each of the second active patterns AP2. A pair of second source/drain patterns SD2 may be formed on opposite sides of each of the sacrificial patterns PP.

For example, the hardmask patterns MA and the gate spacers GS may be used as an etching mask to etch the upper portions of the second active patterns AP2, which may result in the formation of second recesses. The second recesses of the second active patterns AP2 may have their inner sidewalls that serve as seed layers used for a selective epitaxial growth process to form the second source/drain patterns SD2. The formation of the second source/drain patterns SD2 may define a second channel pattern CH2 between a pair of second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 9 and 10A to 10D, a first interlayer dielectric layer 110 may be formed to cover the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be utilized to planarize the first interlayer dielectric layer 110. The hardmask patterns MA may all be removed during the planarization process. As a result, the first interlayer dielectric layer 110 may have a top surface substantially coplanar with those of the sacrificial patterns PP and those of the gate spacers GS.

The sacrificial patterns PP may be replaced with gate electrodes GE. For example, the exposed sacrificial patterns PP may be selectively removed. The removal of the sacrificial patterns PP may form empty spaces. A gate dielectric pattern GI, a gate electrode GE, and a gate capping pattern GP may be formed in each of the empty spaces.

A method of forming the gate dielectric pattern GI and the gate electrode GE will be discussed in detail below with reference to FIGS. 11, 12, and 13. Referring to FIGS. 9 and 11, a gate dielectric layer GIL may be formed to partially fill an empty space ET where the sacrificial pattern PP is removed. The gate dielectric layer GIL may include a high-k dielectric material.

A first work function metal layer WFL1 may be formed on the gate dielectric layer GIL, partially filling the empty space ET. The first work function metal layer WFL1 may be formed thicker than the gate dielectric layer GIL. The first work function metal layer WFL1 may include a p-type work function metal whose work function is relatively high. For example, the first work function metal layer WFL1 may include a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer. A filling material FM may be formed on the first work function metal layer WFL1, filling a lower portion of the empty space ET.

Referring to FIGS. 9 and 12, the filling material FM may be used as a mask to etch the first work function metal layer WFL1 and the gate dielectric layer GIL to respectively form a first metal pattern WF1 and a gate dielectric pattern GI. For example, the first work function metal layer WFL1 and the gate dielectric layer GIL may be chamfered to form the first metal pattern WF1 and the gate dielectric pattern GI, respectively. The first metal pattern WF1 may have a recessed top surface RSt lower than the top surface of the gate spacer GS.

Referring to FIGS. 9 and 13, the filling material FM may be selectively removed. A second work function metal layer WFL2, a third work function metal layer WFL3, and a fourth work function metal layer WFL4 may be sequentially formed on the first metal pattern WF1.

The second work function metal layer WFL2 may include an n-type work function metal whose work function is relatively low. The second work function metal layer WFL2 may include metal carbide doped with (or containing) one or more of silicon and aluminum.

The third work function metal layer WFL3 may be formed thinner than the second work function metal layer WFL2. The third work function metal layer WFL3 may include a p-type work function metal whose work function is relatively high. The third work function metal layer WFL3 may include an amorphous metal layer that is capable of inhibiting/preventing the diffusion of materials. The third work function metal layer WFL3 may include an amorphous tungsten carbon nitride (WCN) layer. For another example, the third work function metal layer WFL3 may include an amorphous metal layer, such as a titanium aluminum nitride (TiAlN) layer, a titanium silicon nitride (TiSiN) layer, a titanium oxynitride (TiON) layer, or a tantalum nitride (TaN) layer.

The fourth work function metal layer WFL4 may be formed thicker than any other work function metal layer. The fourth work function metal layer WFL4 may include a p-type work function metal whose work function is relatively high. For example, the fourth work function metal layer WFL4 may include a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer.

An electrode layer ELL may be formed on the fourth work function metal layer WFL4, completely filling the empty space ET. The electrode layer ELL may include low-resistance metal such as tungsten (W).

In some embodiments of the present inventive concepts, the formation of the electrode layer ELL may include using a tungsten-fluorine (WF6) gas to perform atomic layer deposition or chemical vapor deposition. Tungsten contained in the WF6 gas may be deposited on the fourth work function metal layer WFL4, forming the electrode layer ELL.

The fourth work function metal layer WFL4 may include crystal grains. The fourth work function metal layer WFL4 may include a grain boundary between the crystal grains. When the electrode layer ELL is formed, fluorine (F) contained in the WF6 gas may diffuse into the third work function metal layer WFL3 through the grain boundary of the fourth work function metal layer WFL4.

Because the third work function metal layer WFL3 is formed of the amorphous metal layer, the third work function metal layer WFL3 may inhibit/prevent fluorine (F) from diffusing into the second work function metal layer WFL2. For example, the third work function metal layer WFL3 may serve as a barrier layer that stops the diffusion of fluorine (F).

In conclusion, according to some embodiments of the present inventive concepts, because the third work function metal layer WFL3 stops the diffusion of fluorine (F), it may be possible to reduce/prevent deterioration of the second work function metal layer WFL2 and to increase effective work functions (eWF) of gate electrodes. Further, transistors may achieve desired threshold voltages.

Referring back to FIGS. 9 and 10A, the second work function metal layer WFL2, the third work function metal layer WFL3, the fourth work function metal layer WFL4, and the electrode layer ELL may be planarized to respectively form a second metal pattern WF2, a first barrier pattern WF3, a second barrier pattern WF4, and an electrode pattern EL. The patterns WF1 to WF4 and the electrode pattern EL may constitute a gate electrode GE. An upper portion of the gate electrode GE may be recessed, and a gate capping pattern GP may be formed on the gate electrode GE.

Referring back to FIGS. 1 and 2A to 2D, a second interlayer dielectric layer 120 may be formed on the first interlayer dielectric layer 110. The second interlayer dielectric layer 120 may include a silicon oxide layer or a low-k oxide layer. For example, the low-k oxide layer may include a carbon-doped silicon oxide layer, such as SiCOH. The second interlayer dielectric layer 120 may be formed by chemical vapor deposition (CVD).

Active contacts AC may be formed to penetrate the second and first interlayer dielectric layers 120 and 110 and to have electrical connection with the first and second source/drain patterns SD1 and SD2. The gate capping pattern GP and the gate spacer GS may be used as a mask to form the active contacts AC in a self-aligned manner. On the device isolation layer ST, a gate contact GC may be formed to penetrate the second interlayer dielectric layer 120 and the gate capping pattern GP and to have electrical connection with the gate electrode GE.

Figure 14A:
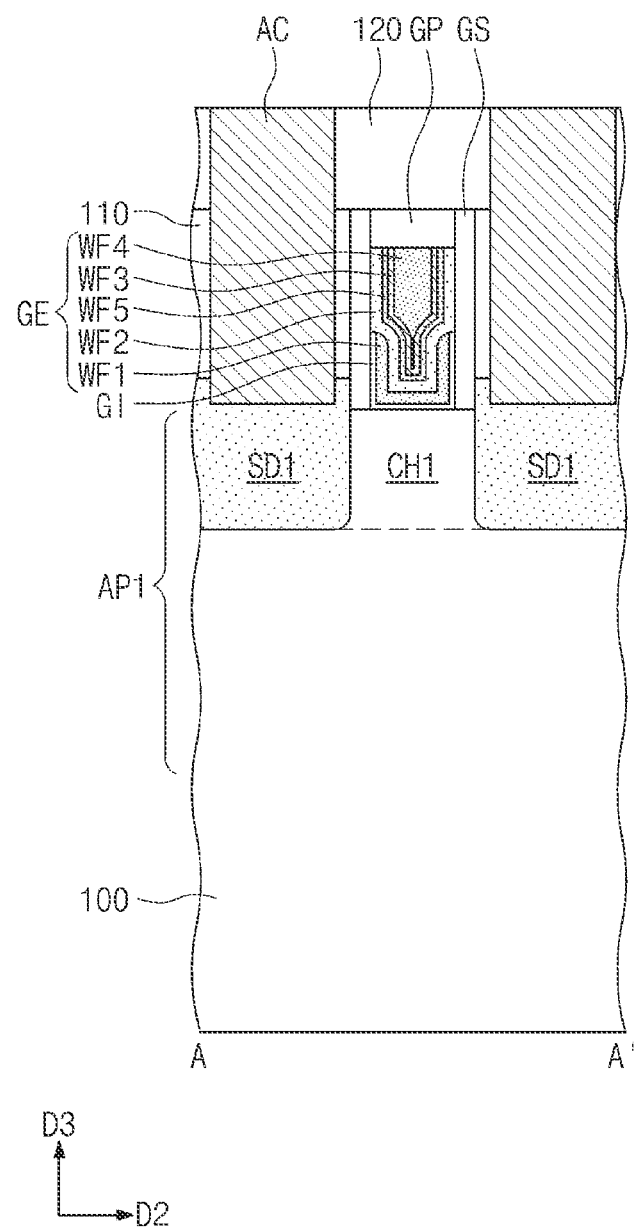
FIGS. 14A and 14B illustrate cross-sectional views respectively taken along lines A-A' and B-B' of FIG. 1, showing a semiconductor device according to some example embodiments of the present inventive concepts.
Figure 14B:
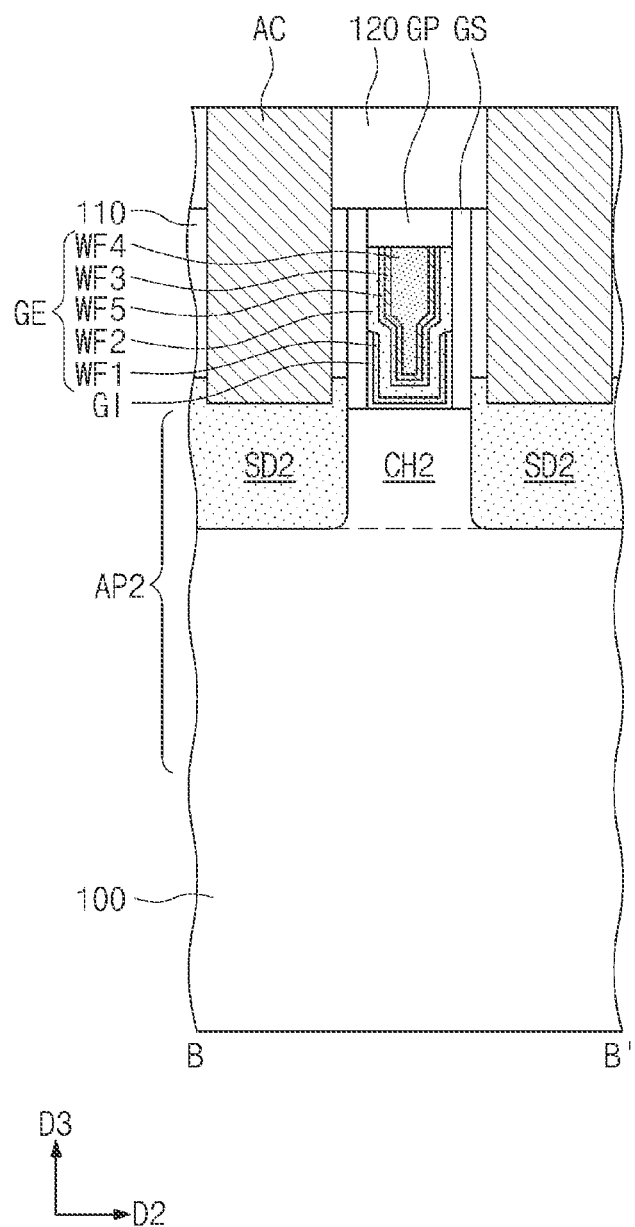
Figure 14C:
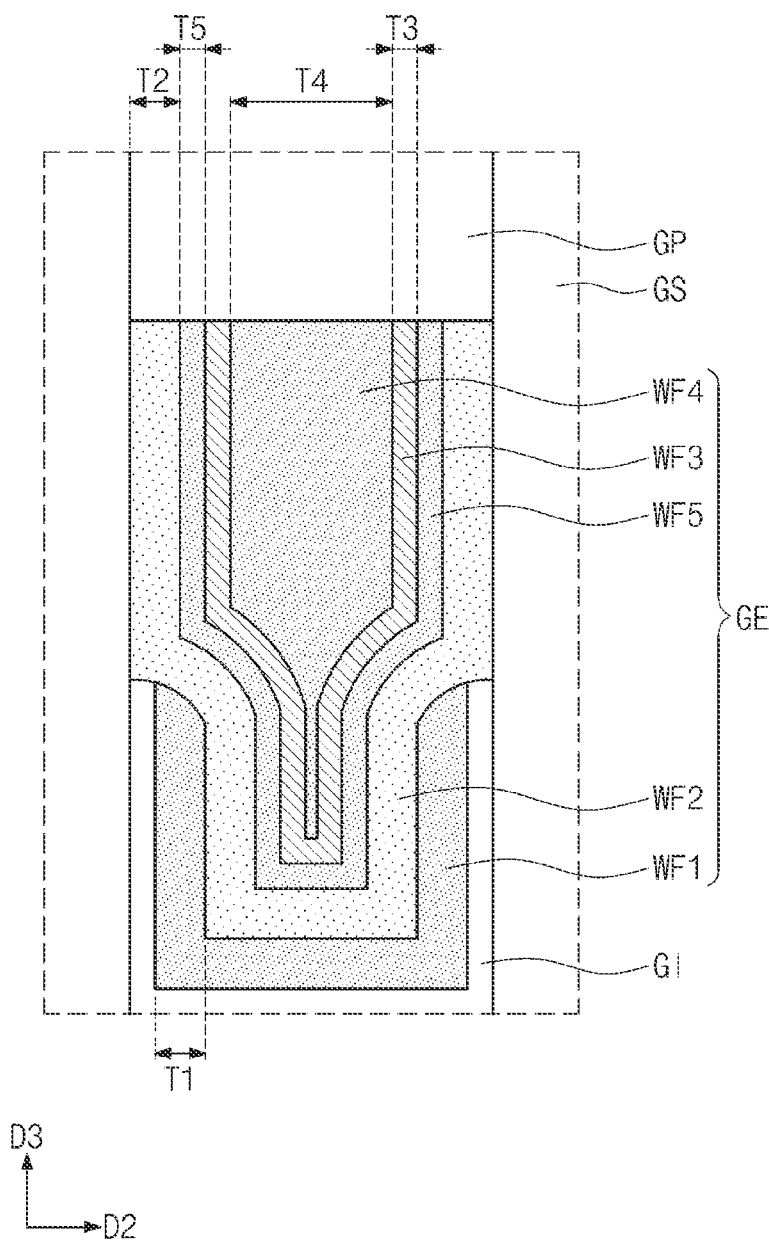
FIG. 14C illustrates an enlarged cross-sectional view showing a gate electrode of FIG. 14A.

FIGS. 14A and 14B illustrate cross-sectional views respectively taken along lines A-A' and B-B' of FIG. 1, showing a semiconductor device according to some example embodiments of the present inventive concepts. FIG. 14C illustrates an enlarged cross-sectional view showing a gate electrode of FIG. 14A. In the example that follows, a detailed description of technical features repetitive to those discussed above with reference to FIGS. 1 and 2A to 2E may be omitted, and differences from those discussed above with reference to FIGS. 1 and 2A to 2E will be discussed in detail.

Referring to FIGS. 1 and 14A to 14C, a third barrier pattern WF5 may be interposed between the second metal pattern WF2 and the first barrier pattern WF3. The third barrier pattern WF5 may have a thickness T5 less than the thickness T2 of the second metal pattern WF2. The third barrier pattern WF5 may include a p-type work function metal whose work function is high. The third barrier pattern WF5 may include a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer. The third barrier pattern WF5 may include the same material as that of the first metal pattern WF1.

When the second metal pattern WF2 is formed, the oxidation of n-type work function metal may cause issues associated with an increase in resistance of the second metal pattern WF2. The third barrier pattern WF5 may be directly provided on the second metal pattern WF2, and thus the second metal pattern WF2 may be protected/prevented from being oxidized. As a result, the gate electrode GE may decrease in resistance.

The thickness T5 of the third barrier pattern WF5 may fall within a range from about 1 nm to about 5 nm (see FIG. 14C). The third barrier pattern WF5 may have an upper portion adjacent to the gate spacer GS, and the thickness T5 may correspond to a width in the second direction D2 of the upper portion of the third barrier pattern WF5.

The electrode pattern EL may be omitted from the gate electrode GE. Because the third barrier pattern WF5 is added in the gate electrode GE, the electrode pattern EL may have no space for the formation thereof. Alternatively, the gate electrode GE may include both the electrode pattern EL and the third barrier pattern WF5. The second barrier pattern WF4 may completely fill a space between a pair of gate spacers GS. Therefore, the thickness T4 of the second barrier pattern WF4 may become relatively large. The thickness T4 of the second barrier pattern WF4 may be similar to a channel length. The thickness T4 may correspond to a width in the second direction D2 of the upper portion of the second barrier pattern WF4.

Figure 15:
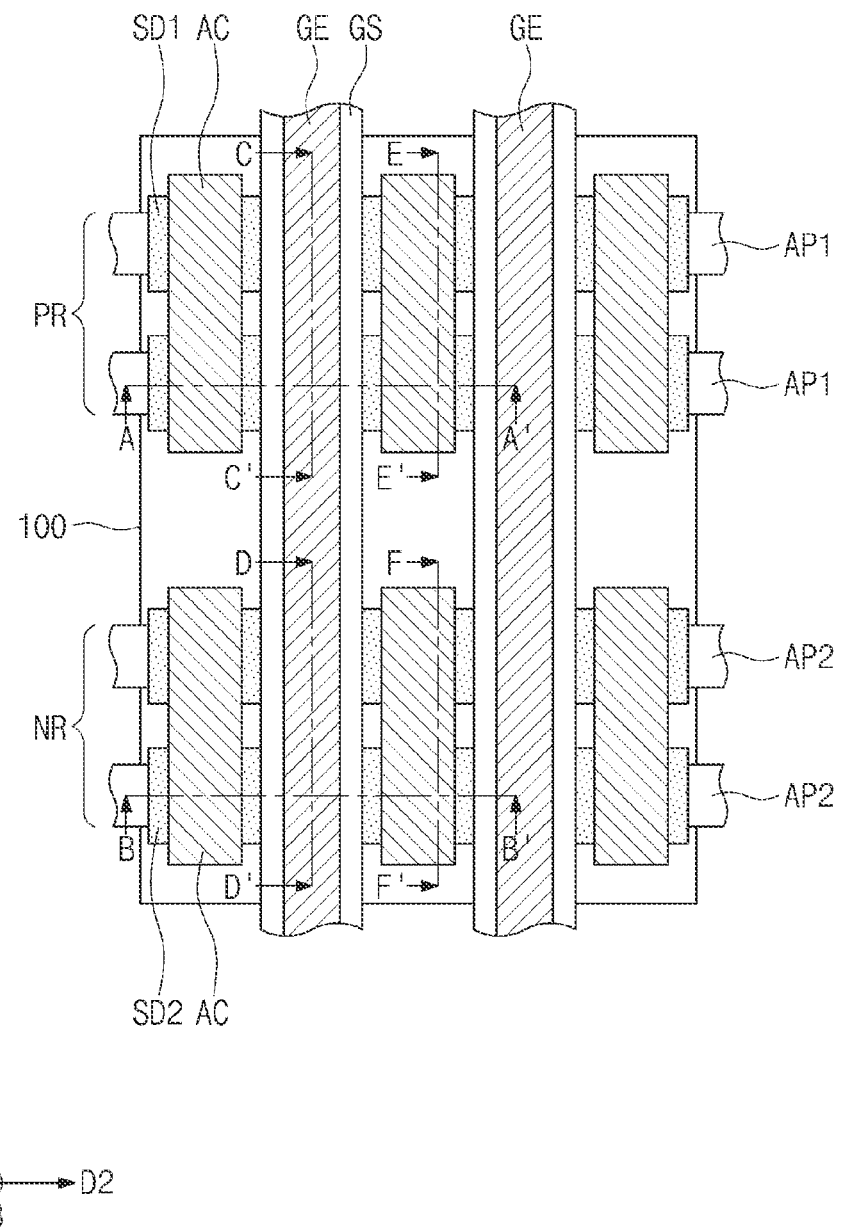
FIG. 15 illustrates a plan view showing a semiconductor device according to some example embodiments of the present inventive concepts.

FIG. 15 illustrates a plan view showing a semiconductor device according to some example embodiments of the present inventive concepts. FIGS. 16A, 16B, 16C, 16D, 16E, and 16F illustrate cross-sectional views respectively taken along lines A-A', B-B', C-C', D-D', E-E', and F-F' of FIG. 15. In the example that follows, a detailed description of technical features repetitive to those discussed above with reference to FIGS. 1 and 2A to 2E may be omitted, and differences from those discussed above with reference to FIGS. 1 and 2A to 2E will be discussed in detail.

Referring to FIGS. 15 and 16A to 16F, a substrate 100 may be provided to include a first region PR and a second region NR. The first region PR and the second region NR may be logic cell regions, each of which includes logic transistors constituting a logic circuit of a semiconductor device. The first region PR may be a PMOSFET area, and the second region NR may be an NMOSFET area.

A trench TR formed on an upper portion of the substrate 100 may define first and second active patterns AP1 and AP2. The first active patterns AP1 may be disposed on the first region PR. The second active patterns AP2 may be disposed on the second region NR. Each of the first and second active patterns AP1 and AP2 may have a linear or bar shape extending in a second direction D2.

A device isolation layer ST may be provided on the substrate 100. The device isolation layer ST may fill the trench TR. The device isolation layer ST may have a top surface lower than those of the first and second active patterns AP1 and AP2.

A first channel pattern CH1 and first source/drain patterns SD1 may be provided on each of the first active patterns AP1. The first channel pattern CH1 may be interposed between a pair of first source/drain patterns SD1. A second channel pattern CH2 and second source/drain patterns SD2 may be provided on each of the second active patterns AP2. The second channel pattern CH2 may be interposed between a pair of second source/drain patterns SD2.

The first channel pattern CH1 may include first, second, and third semiconductor patterns SP1, SP2, and SP3 that are sequentially stacked. The first, second, and third semiconductor patterns SP1, SP2, and SP3 may be spaced apart from each other in a third direction D3 perpendicular to a top surface of the substrate 100. The first, second, and third semiconductor patterns SP1, SP2, and SP3 may vertically overlap each other. Each of the first source/drain patterns SD1 may directly contact a sidewall of each of the first, second, and third semiconductor patterns SP1, SP2, and SP3. The first, second, and third semiconductor patterns SP1, SP2, and SP3 may electrically connect a pair of adjacent first source/drain patterns SD1.

The first, second, and third semiconductor patterns SP1, SP2, and SP3 of the first channel pattern CH1 may have the same thickness or different thicknesses. The first, second, and third semiconductor patterns SP1, SP2, and SP3 of the first channel pattern CH1 may have different maximum lengths in the second direction D2. For example, a first length may refer to the maximum length in the second direction D2 of the first semiconductor pattern SP1. A second length may refer to the maximum length in the second direction D2 of the second semiconductor pattern SP2. A third length may refer to the maximum length in the second direction D2 of the third semiconductor pattern SP3. The first length may be greater than the second length. The third length may be greater than the second length.

The first, second, and third semiconductor patterns SP1, SP2, and SP3 of the first channel pattern CH1 may include one or more of silicon (Si), germanium (Ge), and silicon-germanium (SiGe). The first channel pattern CH1 is illustrated to include the first, second, and third semiconductor patterns SP1, SP2, and SP3, but the number of semiconductor patterns is not particularly limited. For example, the first channel pattern CH1 may include at least two semiconductor patterns.

The second channel pattern CH2 may include first, second, and third semiconductor patterns SP1, SP2, and SP3 that are sequentially stacked. The first, second, and third semiconductor patterns SP1, SP2, and SP3 of the second channel pattern CH2 may have substantially the same length in the second direction D2. A detailed description of the first, second, and third semiconductor patterns SP1, SP2, and SP3 included in the second channel pattern CH2 may be substantially identical or similar to that of the first, second, and third semiconductor patterns SP1, SP2, and SP3 included in the first channel pattern CH1 discussed above.

The first, second, and third semiconductor patterns SP1, SP2, and SP3 of the first channel pattern CH1 and a first recess RS1 of the first active pattern AP1 may serve as a seed layer from which each of the first source/drain patterns SD1 is grown as an epitaxial pattern. Each of the first source/drain patterns SD1 may fill the first recess RS1 of the first active pattern AP1. The first recess RS1 may be defined between adjacent first channel patterns CH1. The first recess RS1 may have a floor whose level is lower than that of the top surface of the first active pattern AP1.

Figure 16A:
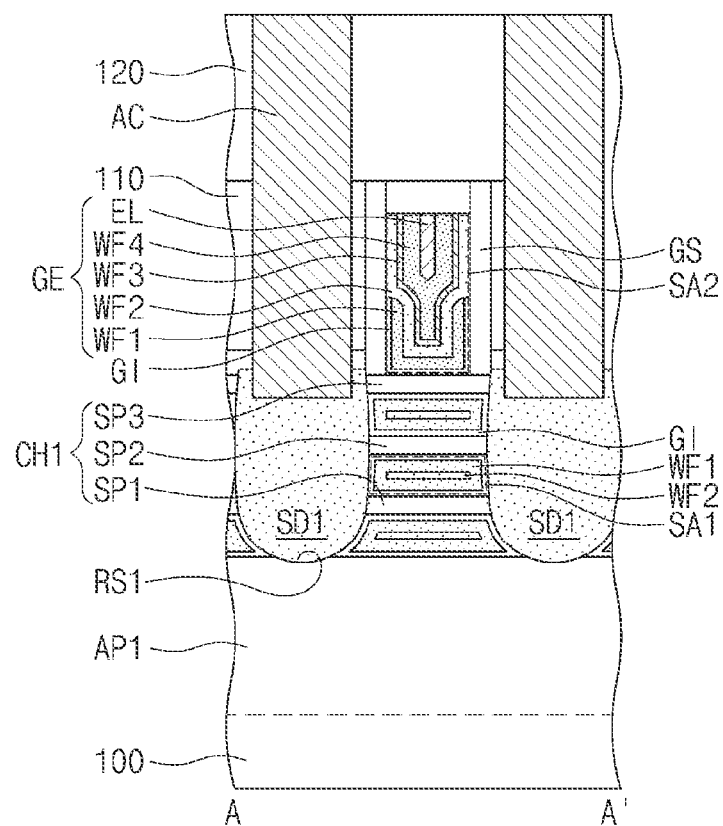
FIGS. 16A, 16B, 16C, 16D, 16E, and 16F illustrate cross-sectional views respectively taken along lines A-A', B-B', C-C', D-D', E-E', and F-F' of FIG. 15.

The first source/drain pattern SD1 may have a maximum width in the second direction D2 at a middle portion thereof (see FIG. 16A). The width in the second direction D2 of the first source/drain pattern SD1 may increase while approaching the middle portion from an upper portion of the first source/drain pattern SD1. The width in the second direction D2 of the first source/drain pattern SD1 may decrease while approaching a lower portion of the first source/drain pattern SD1 from the middle portion.

The first source/drain patterns SD1 may be impurity regions having a first conductivity type (e.g., p-type). The first source/drain patterns SD1 may provide the first channel patterns CH1 with compressive stress. For example, the first source/drain patterns SD1 may include a semiconductor element (e.g., SiGe) whose lattice constant is greater than that of a semiconductor element of the substrate 100.

The first, second, and third semiconductor patterns SP1, SP2, and SP3 of the second channel pattern CH2 and a second recess RS2 of the second active pattern AP2 may serve as a seed layer from which each of the second source/drain patterns SD2 is grown as an epitaxial pattern. Each of the second source/drain patterns SD2 may fill the second recess RS2 of the second active pattern AP2. The second recess RS2 may be defined between adjacent second channel patterns CH2. The second recess RS2 may have a floor whose level is lower than that of the top surface of the second active pattern AP2.

The second source/drain patterns SD2 may be impurity regions having a second conductivity type (e.g., n-type). For example, the second source/drain patterns SD2 may include the same semiconductor element (e.g. Si) as that of the substrate 100.

Gate electrodes GE may be provided to extend in a first direction D1, while running (i.e., extending) across the first and second channel patterns CH1 and CH2. The gate electrodes GE may be spaced apart from each other in the second direction D2. The gate electrodes GE may vertically overlap the first and second channel patterns CH1 and CH2. A pair of gate spacers GS may be provided on opposite sidewalls of each of the gate electrodes GE. A gate capping pattern GP may be provided on the gate electrode GE.

The gate electrode GE may include a first metal pattern WF1, a second metal pattern WF2, a first barrier pattern WF3, a second barrier pattern WF4, and an electrode pattern EL that are sequentially stacked. A detailed description of the patterns WF1 to WF4 and the electrode pattern EL may be substantially the same as that discussed above with reference to FIGS. 1 and 2A to 2E.

Figure 16B:
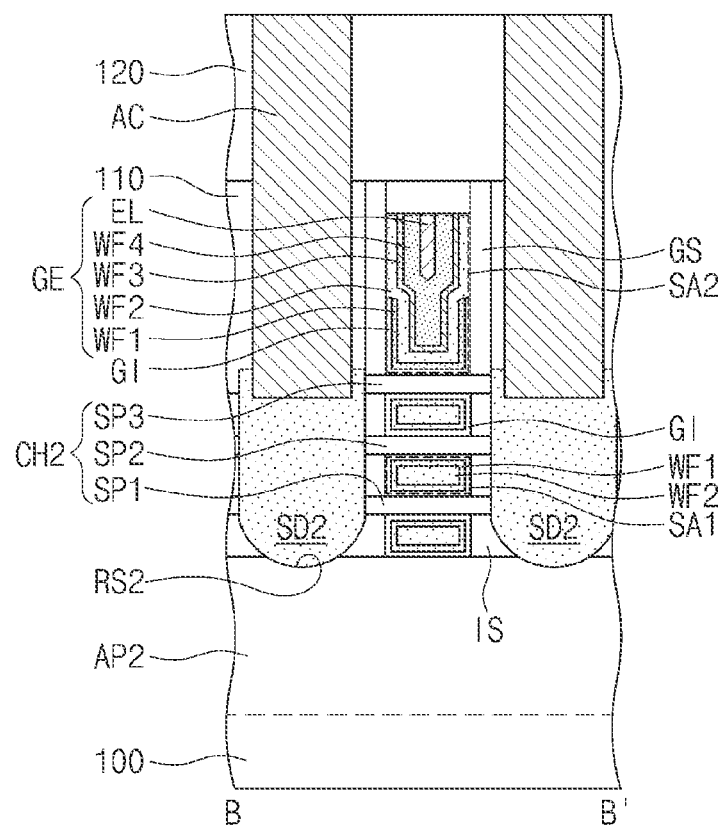
Figure 16C:
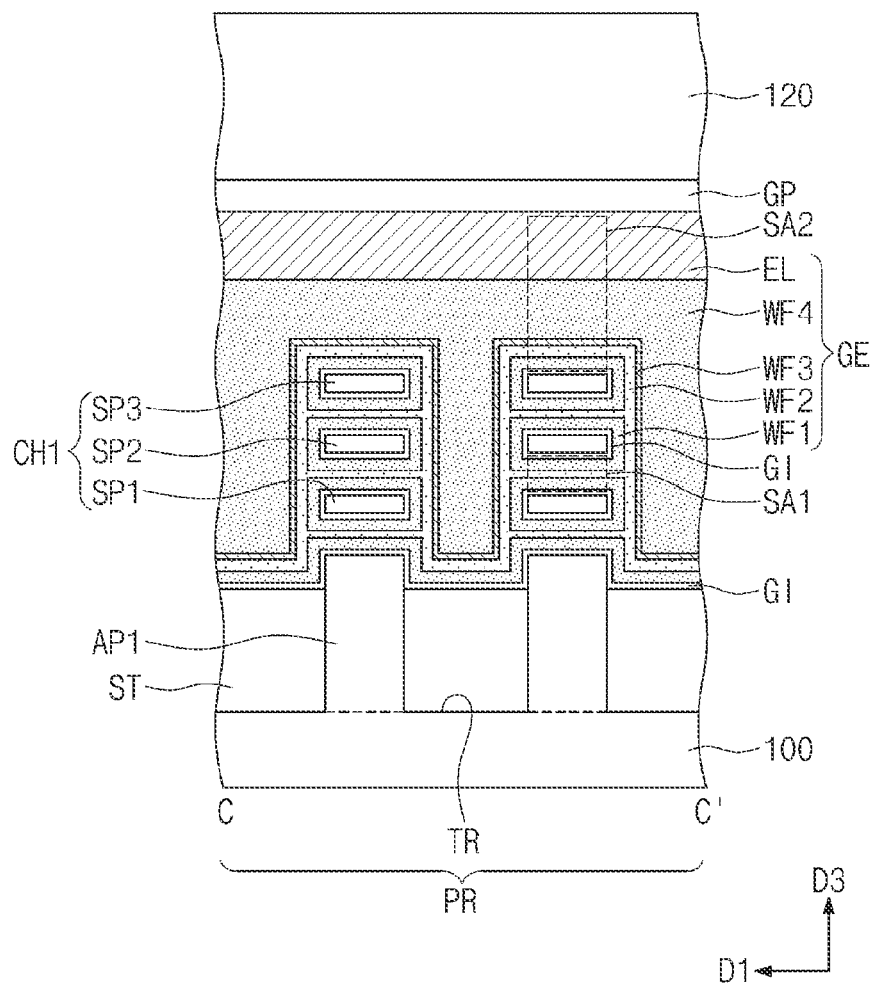
Figure 16D:
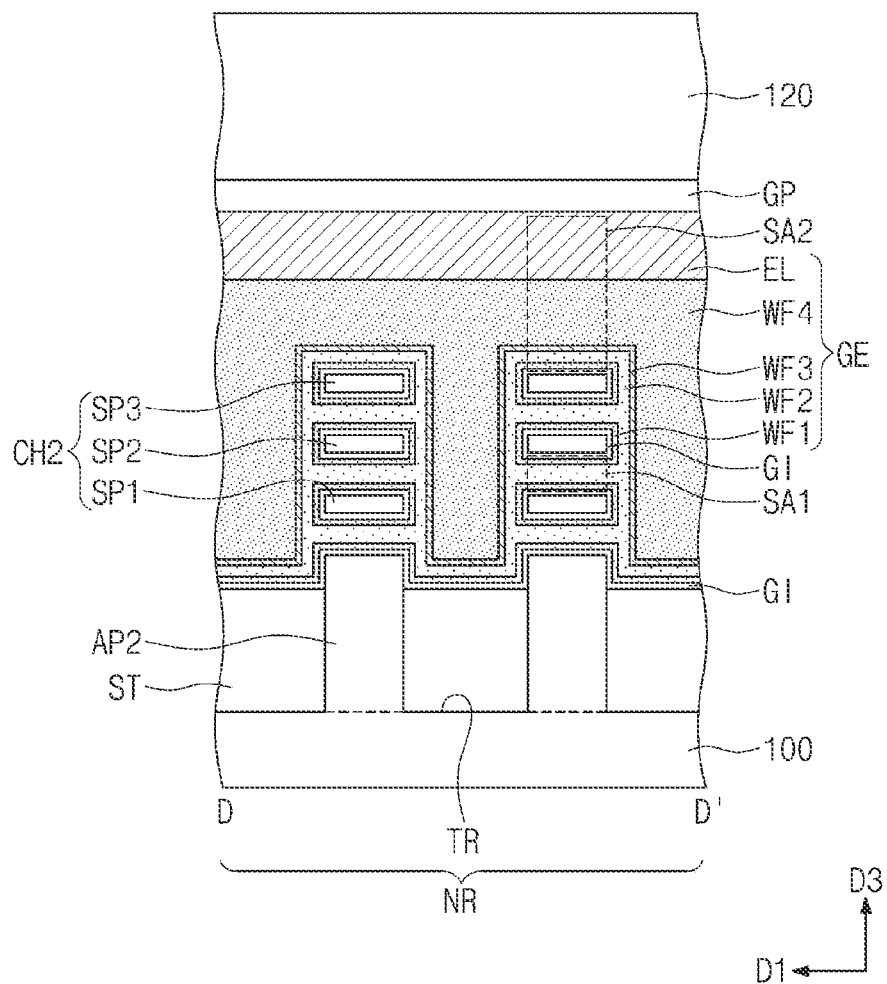
Figure 16E:
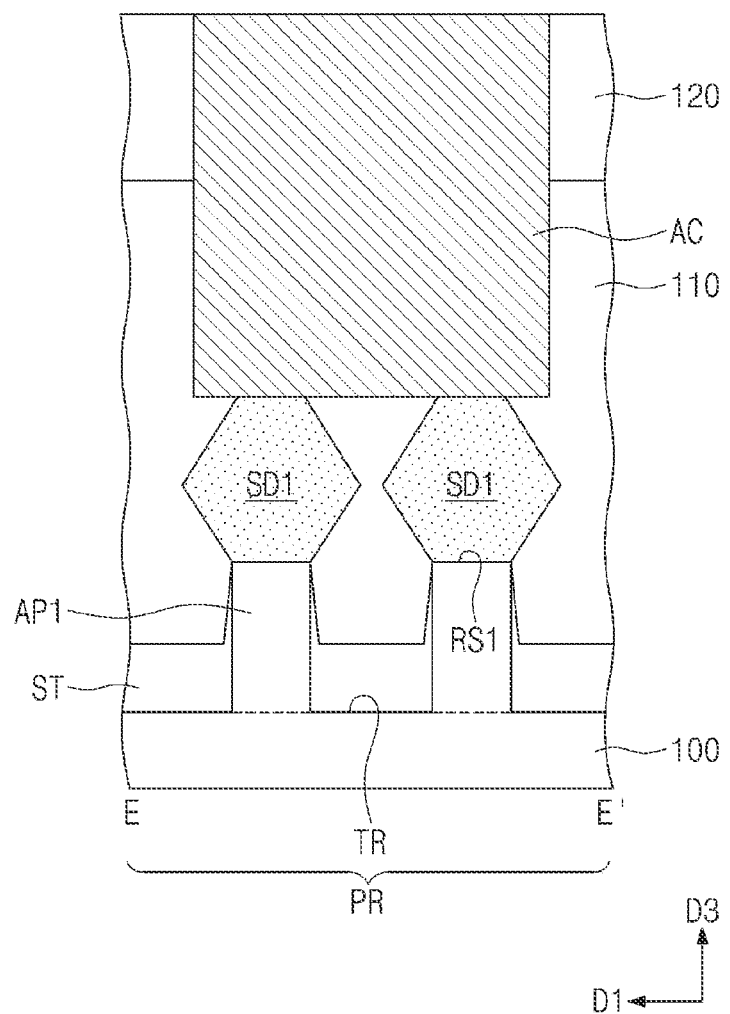
Figure 16F:
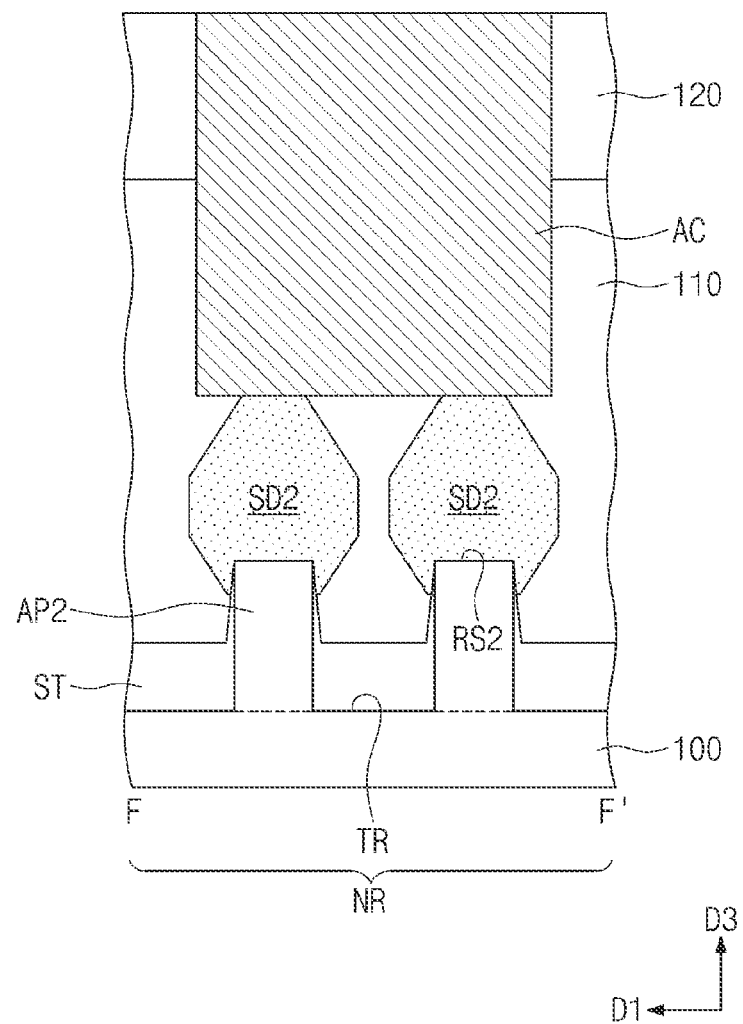

The gate electrode GE according to some embodiments may surround each of the first, second, and third semiconductor patterns SP1, SP2, and SP3 (see FIGS. 16C and 16D). For example, the gate electrode GE may surround top and bottom surfaces and opposite sidewalls of each of the first, second, and third semiconductor patterns SP1, SP2, and SP3. In such configurations, transistors according to some embodiments may be gate-all-around type field effect transistors.

A gate dielectric pattern GI may be interposed between the gate electrode GE and each of the first, second, and third semiconductor patterns SP1, SP2, and SP3. The gate dielectric pattern GI may surround each of the first, second, and third semiconductor patterns SP1, SP2, and SP3. The gate dielectric pattern GI may cover an upper portion of the first active pattern AP1, and the upper portion of the first active pattern AP1 may vertically protrude from the device isolation layer ST. The gate dielectric pattern GI may include a high-k dielectric material whose dielectric constant is greater than that of a silicon oxide layer.

A first space SA1 may be defined between the first and second semiconductor patterns SP1 and SP2 of the first channel pattern CH1. For example, the first space SA1 may be defined between a pair of vertically adjacent ones of the first, second, and third semiconductor patterns SP1, SP2, and SP3.

The first space SA1 may be filled with the gate dielectric pattern GI, the first metal pattern WF1, and the second metal pattern WF2. The gate dielectric pattern GI and the first metal pattern WF1 may conformally fill the first space SAL. The second metal pattern WF2 may completely fill a remaining portion of the first space SA1 that is not occupied by the gate dielectric pattern GI and the first metal pattern WF1.

The first space SA1 may not be filled with the first barrier pattern WF3, the second barrier pattern WF4, and the electrode pattern EL. For example, the first space SA1 may have therein none of the first barrier pattern WF3, the second barrier pattern WF4, and the electrode pattern EL.

Referring back to FIGS. 16C and 16D, the second metal pattern WF2 may not completely fill the first space SA1. The second metal pattern WF2 may cover the first metal patterns WF1 that correspondingly surround the first, second, and third semiconductor patterns SP1, SP2, and SP3. Therefore, the first barrier pattern WF3 may not be in the first space SA1, but may cover only a surface of the second metal pattern WF2.

Referring back to FIGS. 15 and 16A to 16F, a second space SA2 may be defined on the third semiconductor pattern SP3, or on an uppermost semiconductor pattern of the first channel pattern CH1. The second space SA2 may be a cavity surrounded by a pair of gate spacers GS, the gate capping pattern GP, and the third semiconductor pattern SP3.

The second space SA2 may be filled with the gate dielectric pattern GI, the patterns WF1 to WF4, and the electrode pattern EL. A detailed shape of the gate electrode GE in the second space SA2 may be substantially the same as that of the gate electrode GE discussed above with reference to FIGS. 1 and 2A to 2E.

On the first region PR, the gate dielectric pattern GI may contact the first source/drain pattern SD1 (see FIG. 16A). For example, the gate dielectric pattern GI may be interposed between the first metal pattern WF1 and the first source/drain pattern SD1.

On the second region NR, an inner spacer IS may be interposed between the second source/drain pattern SD2 and the gate dielectric pattern GI (see FIG. 16B). The inner spacer IS may be interposed between vertically spaced ones of the first, second, and third semiconductor patterns SP1, SP2, and SP3. The gate dielectric pattern GI on the second region NR may contact the inner spacer IS. For example, the gate dielectric pattern GI on the second region NR may be interposed between the first metal pattern WF1 and the inner spacer IS. The inner spacer IS may include, for example, a silicon nitride layer.

A first interlayer dielectric layer 110 may be provided on an entire surface of the substrate 100. The first interlayer dielectric layer 110 may cover the device isolation layer ST, the gate spacers GS, and the first and second source/drain patterns SD1 and SD2. The first interlayer dielectric layer 110 may have a top surface substantially coplanar with that of the gate capping pattern GP. A second interlayer dielectric layer 120 may be provided on the first interlayer dielectric layer 110. For example, the first and second interlayer dielectric layers 110 and 120 may include a silicon oxide layer or a silicon oxynitride layer. One or more active contacts AC may be provided to penetrate the first and second interlayer dielectric layers 110 and 120 and to have connection with the first and second source/drain patterns SD1 and SD2.

Figure 24A:
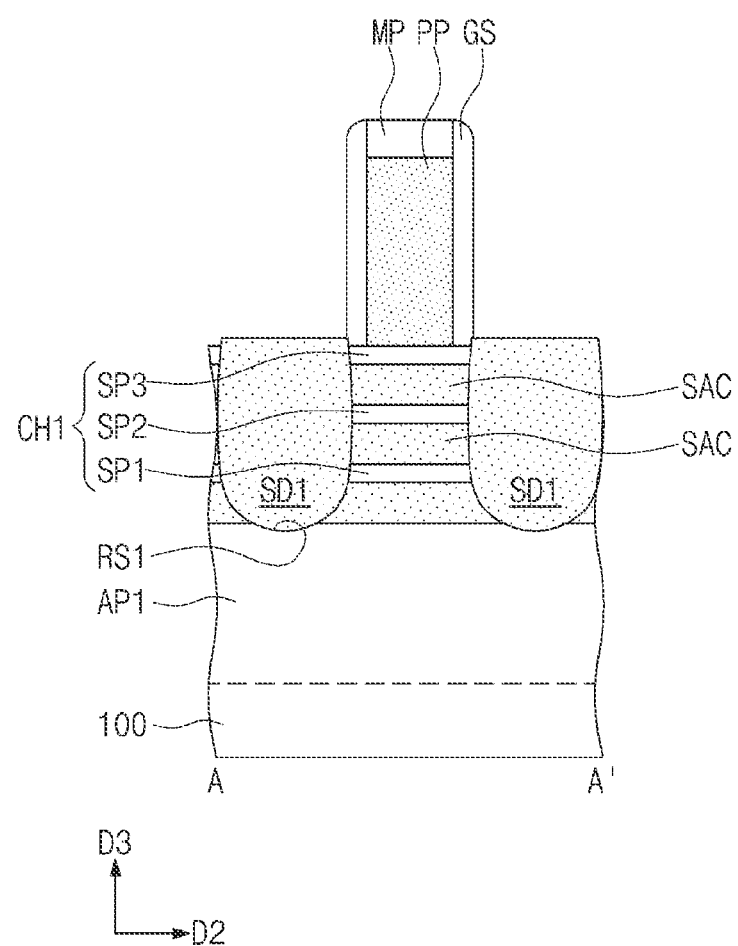
Figure 24B:
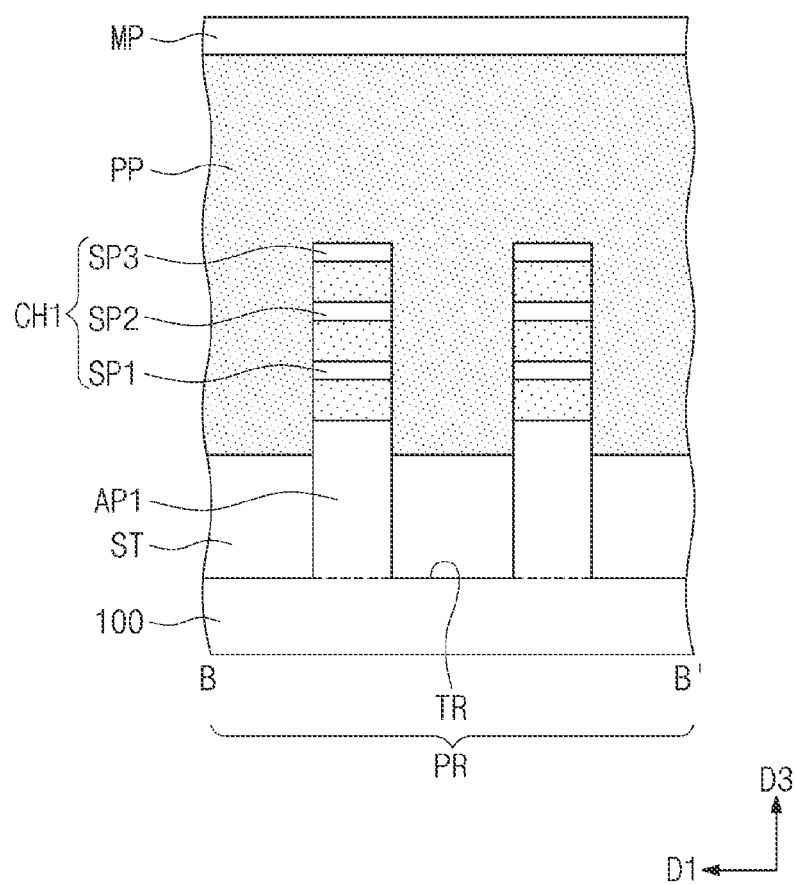
Figure 24C:
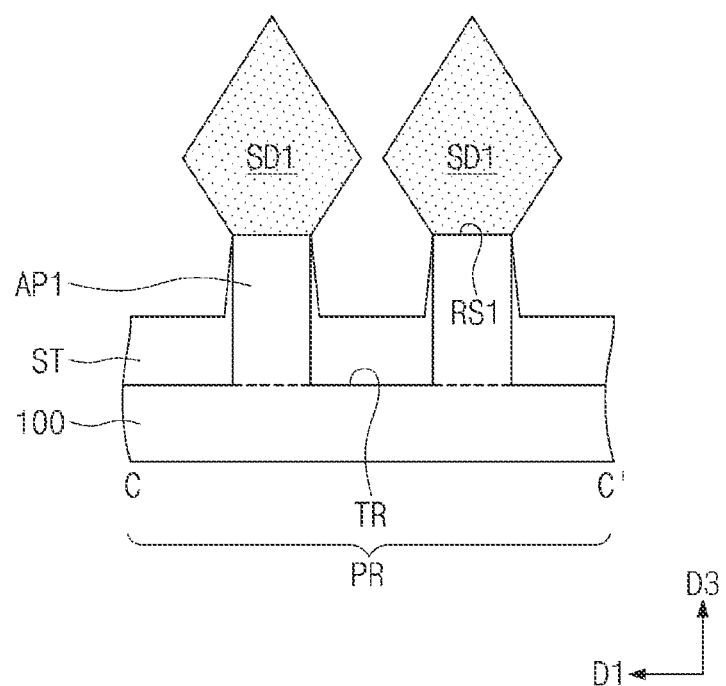
FIGS. 24C, 26C, and 28C illustrate cross-sectional views taken along line C-C' of FIGS. 23, 25, and 27, respectively.
Figure 25:
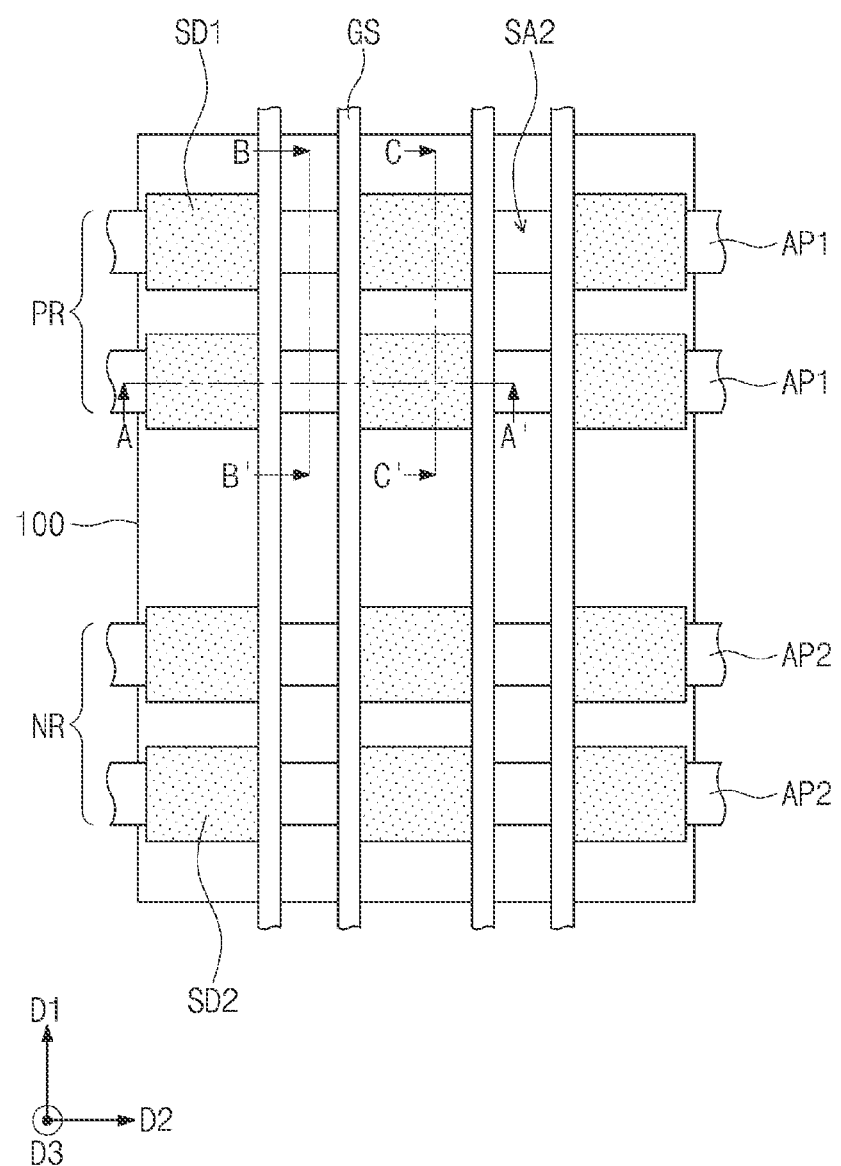
Figure 26A:
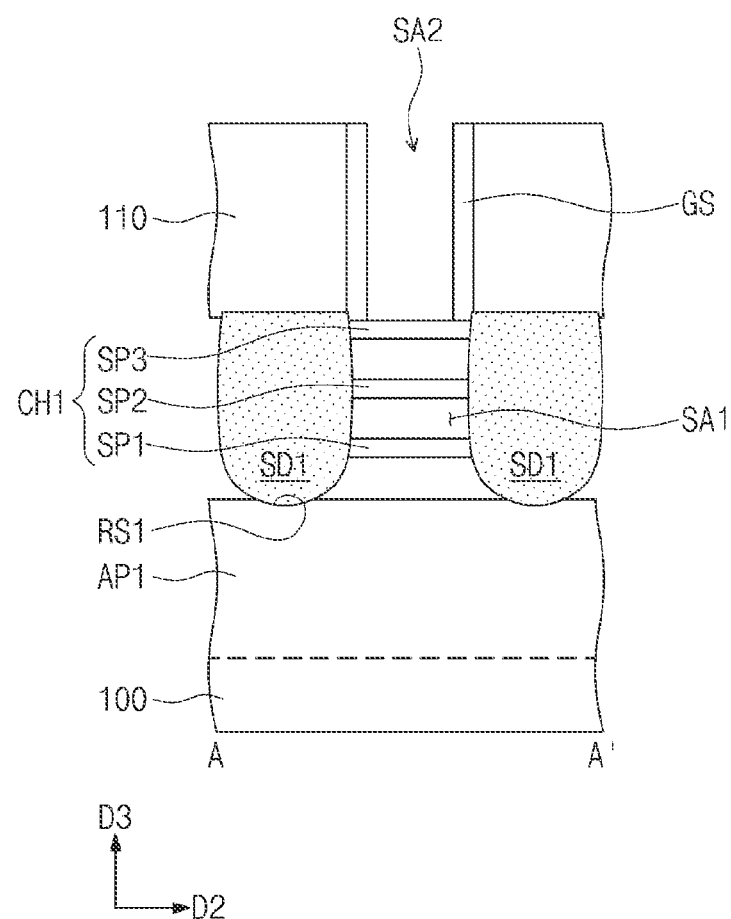
Figure 26B:
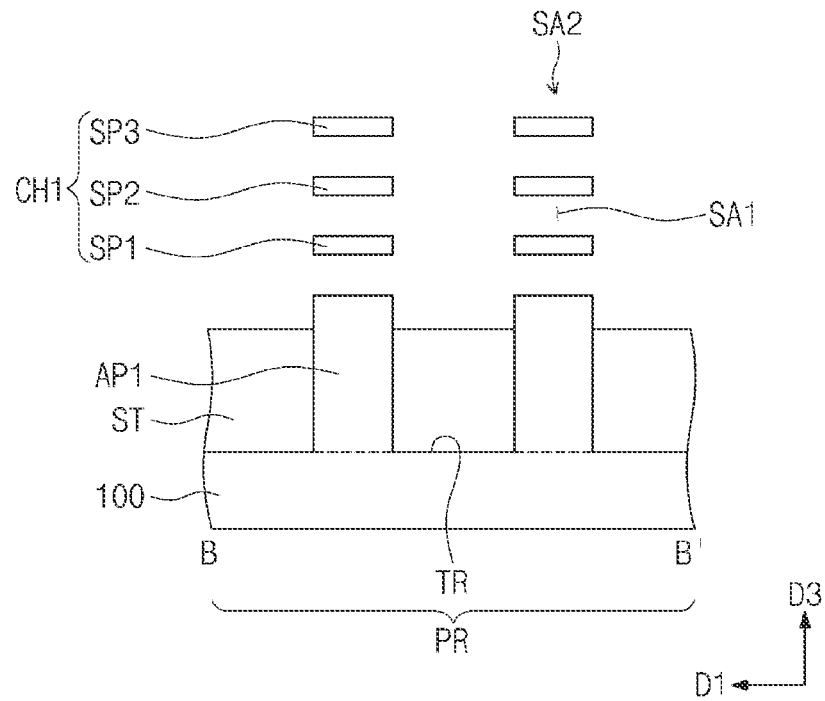
Figure 26C:
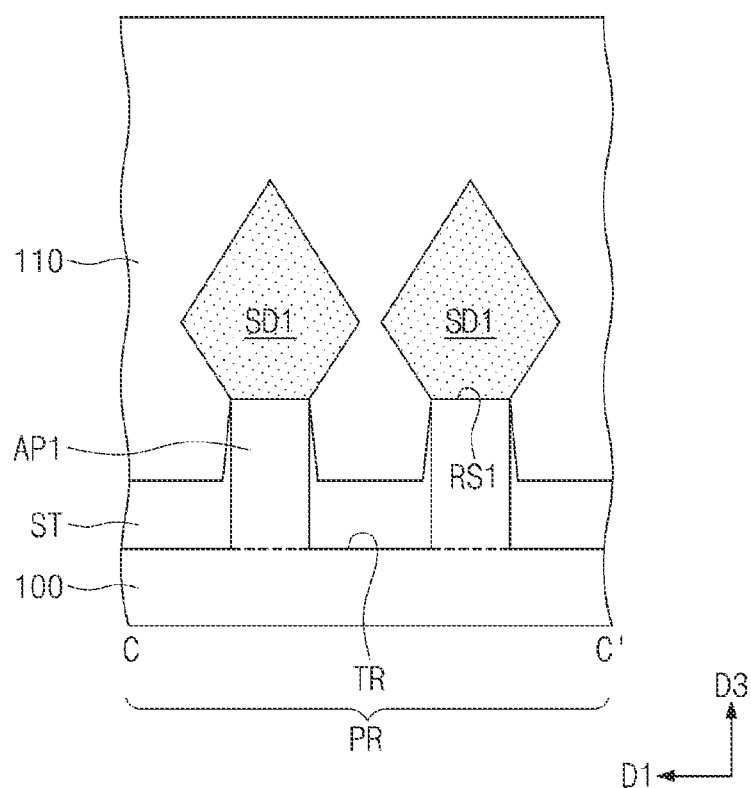
Figure 27:
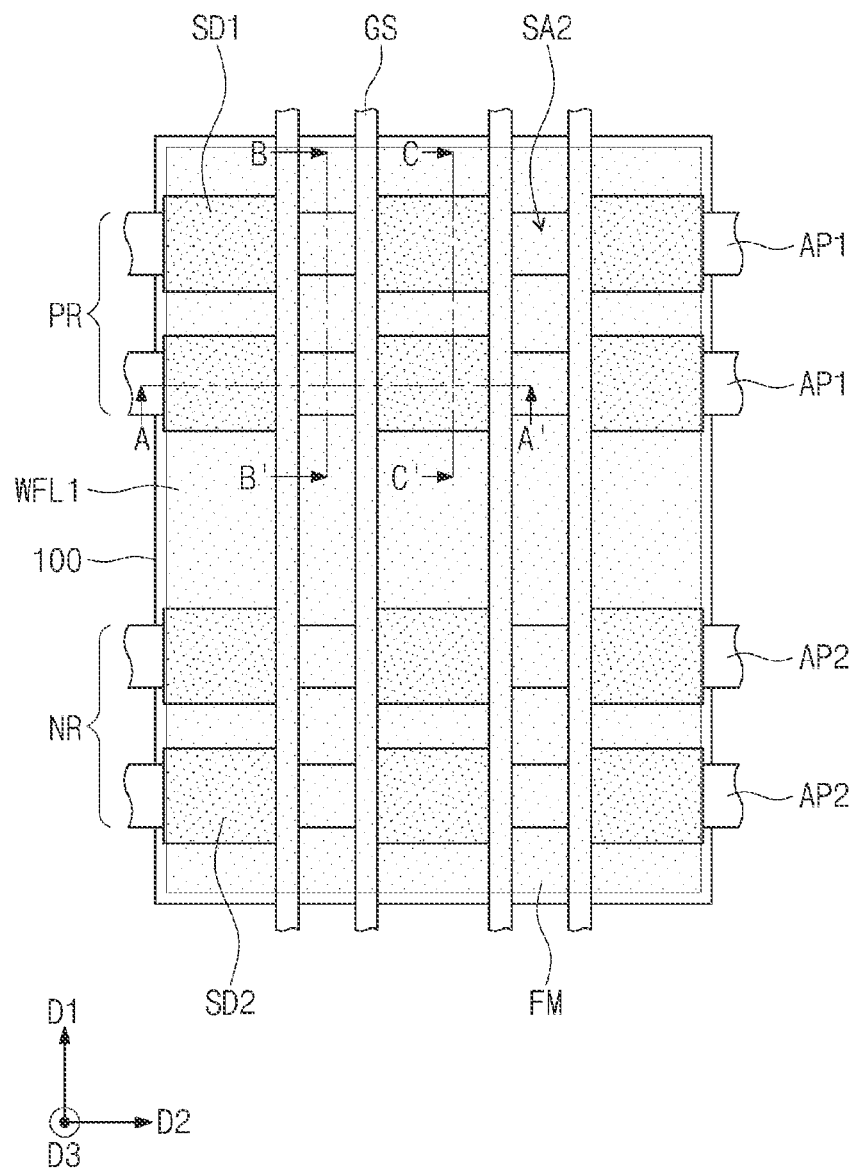
Figure 28A:
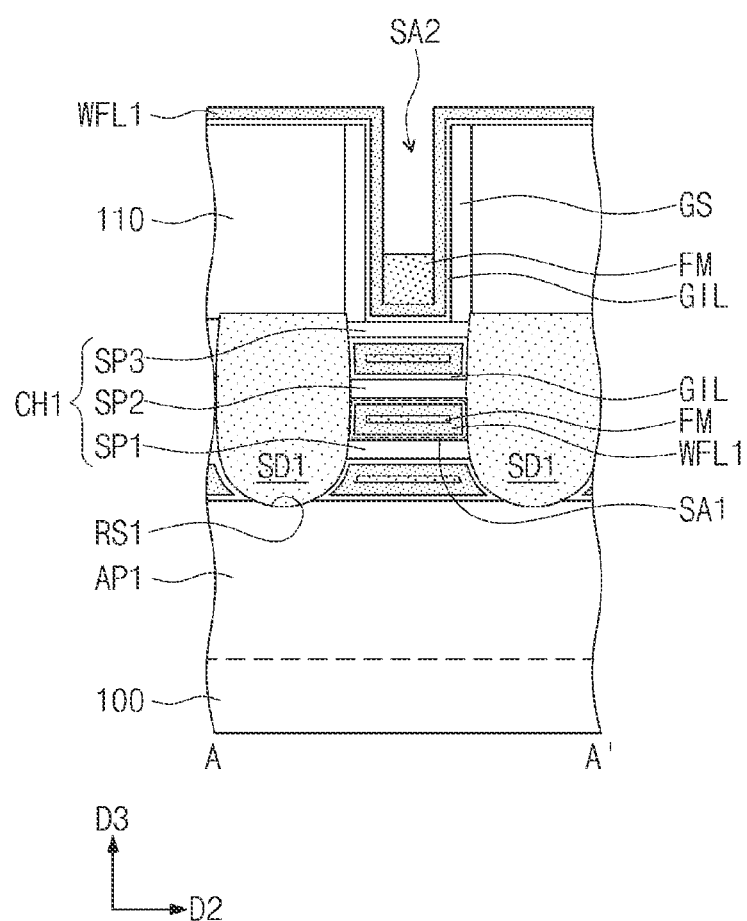
Figure 28B:
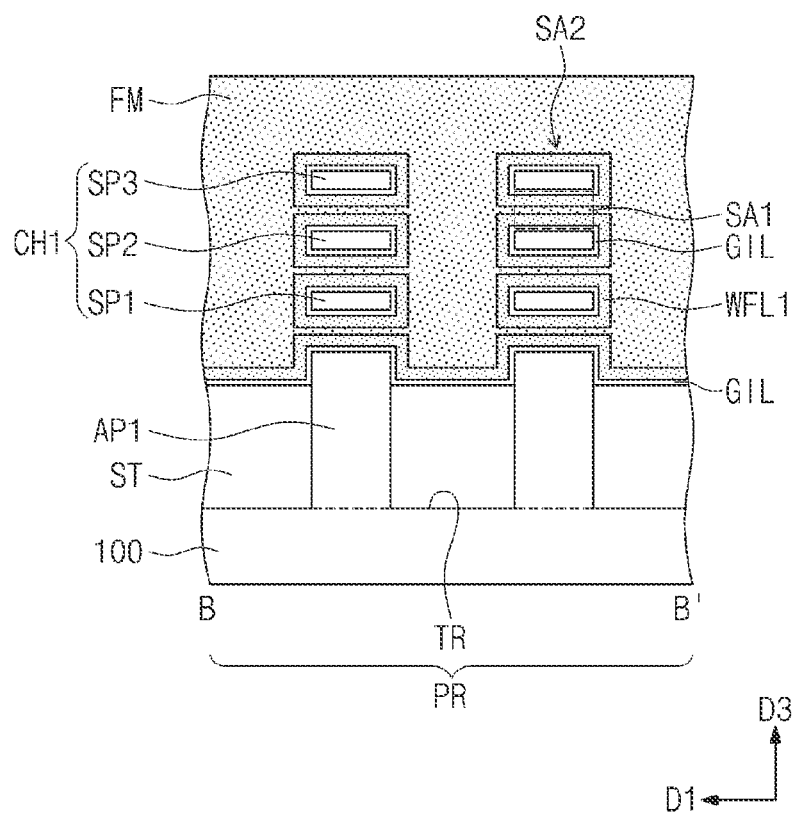
Figure 28C:
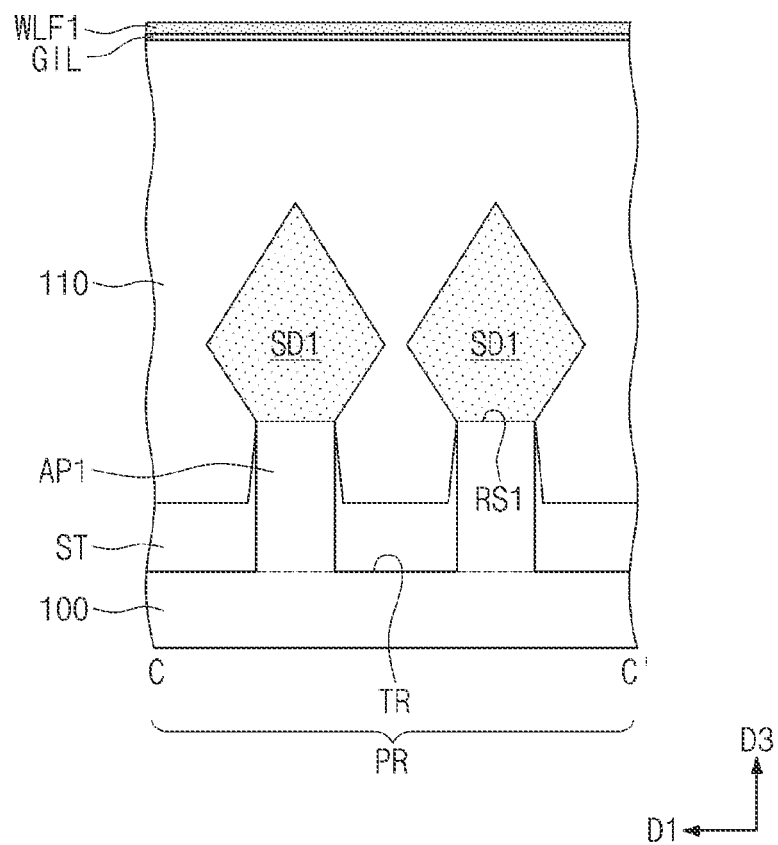

FIGS. 17, 19, 21, 23, 25, and 27 illustrate plan views showing a method of fabricating a semiconductor device according to some example embodiments of the present inventive concepts. FIGS. 18, 20A, 22A, 24A, 26A, and 28A illustrate cross-sectional views taken along line A-A' of FIGS. 17, 19, 21, 23, 25, and 27, respectively. FIGS. 20B, 22B, 24B, 26B, and 28B illustrate cross-sectional views taken along line B-B' of FIGS. 19, 21, 23, 25, and 27, respectively. FIGS. 24C, 26C, and 28C illustrate cross-sectional views taken along line C-C' of FIGS. 23, 25, and 27, respectively. In the example that follows, a detailed description of technical features repetitive to those discussed above with reference to FIGS. 3 to 13 may be omitted, and differences from those discussed above with reference to FIGS. 3 to 13 will be explained in detail.

Figure 17:
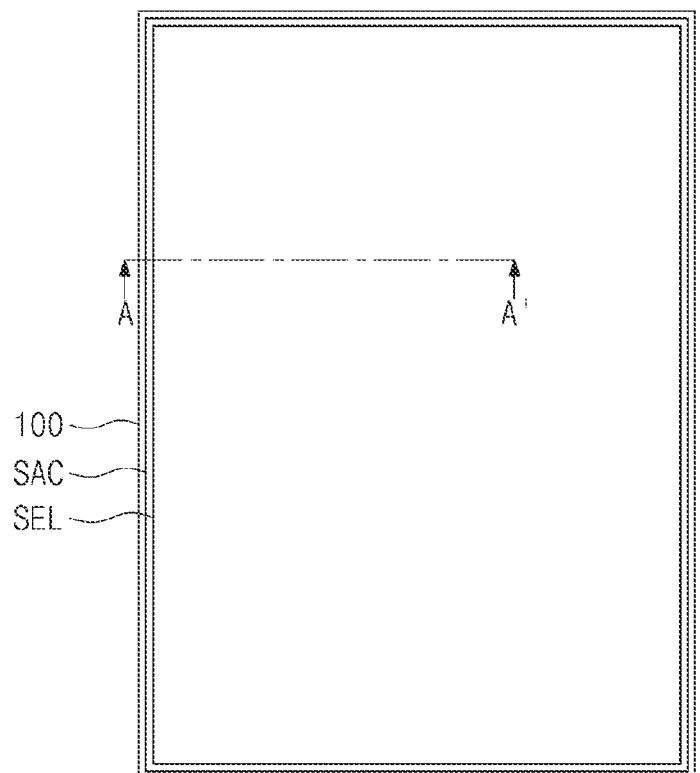
FIGS. 17, 19, 21, 23, 25, and 27 illustrate plan views showing a method of fabricating a semiconductor device according to some example embodiments of the present inventive concepts.
Figure 17:
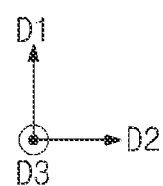
Figure 18:
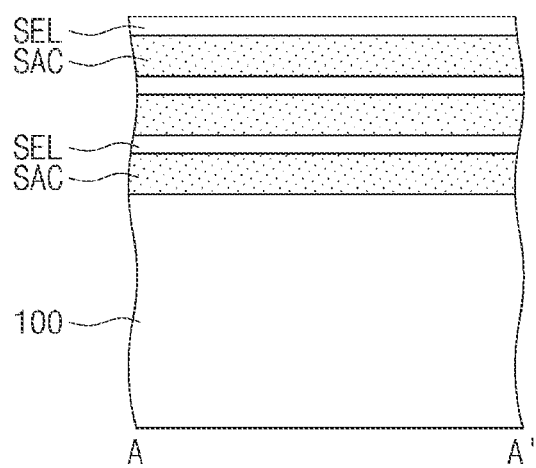
FIGS. 18, 20A, 22A, 24A, 26A, and 28A illustrate cross-sectional views taken along line A-A' of FIGS. 17, 19, 21, 23, 25, and 27, respectively.
Figure 18:
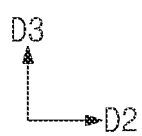

Referring to FIGS. 17 and 18, sacrificial layers SAC and semiconductor layers SEL may be alternately and repeatedly stacked on an entire surface (e.g., an entire top surface) of a substrate 100. It is illustrated that the semiconductor layers SEL are repeatedly stacked three times, but the present inventive concepts are not limited thereto. The sacrificial layers SAC may include a material having an etch selectivity with respect to the semiconductor layers SEL. In this sense, the semiconductor layers SEL may include a material that substantially cannot be etched in a process in which the sacrificial layers SAC are etched. For example, the sacrificial layers SAC may include silicon-germanium (SiGe) or germanium (Ge), and the semiconductor layers SEL may include silicon (Si).

Figure 19:
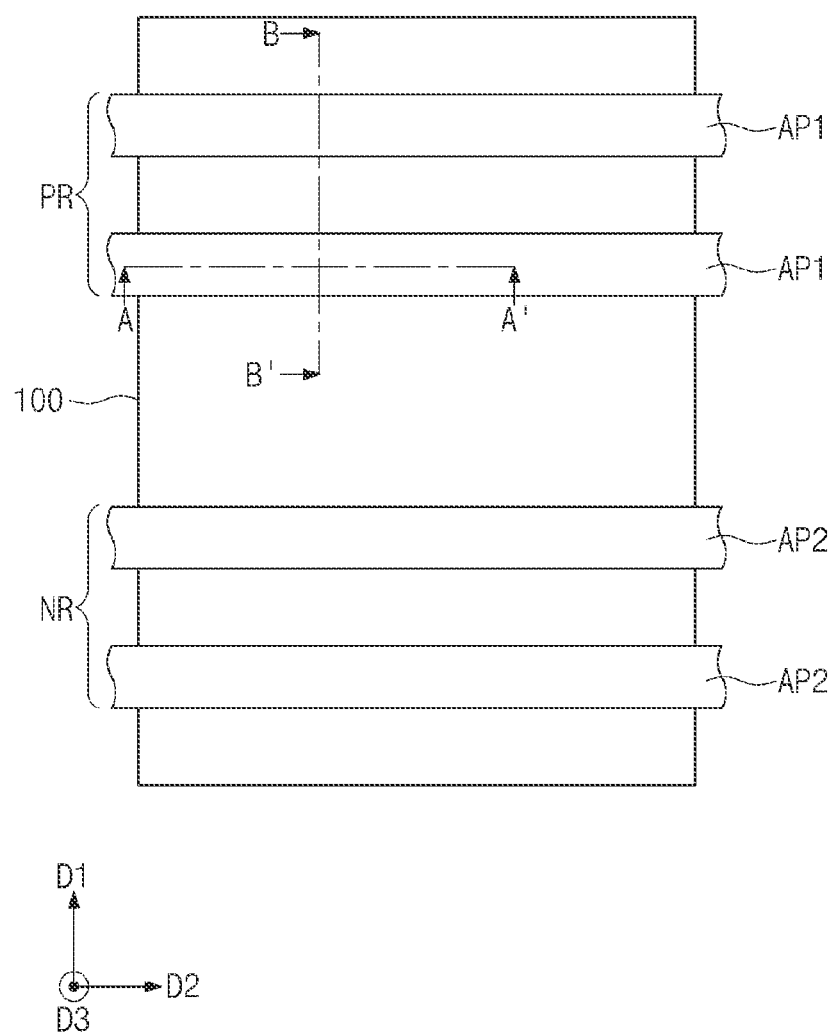
Figure 20A:
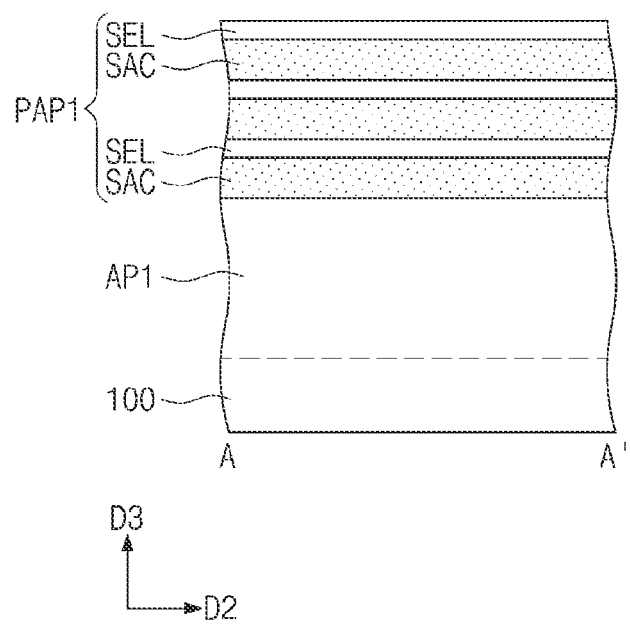
Figure 20B:
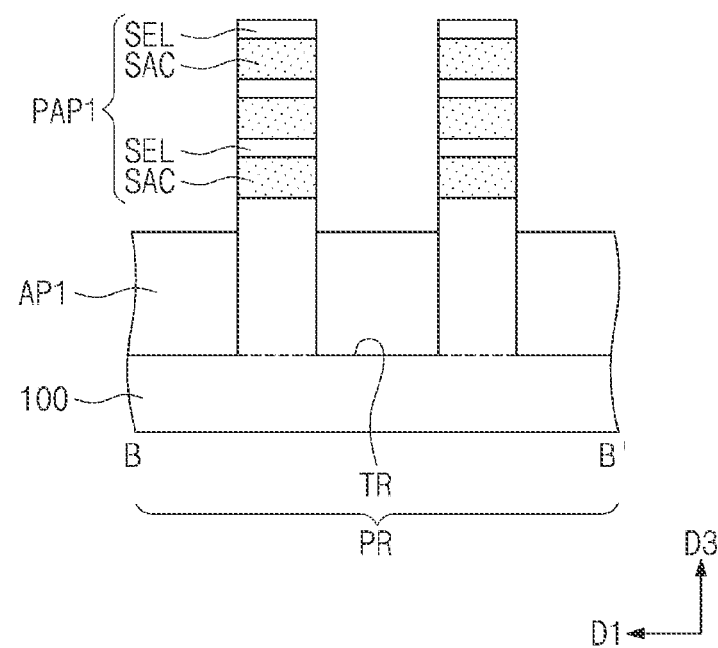
FIGS. 20B, 22B, 24B, 26B, and 28B illustrate cross-sectional views taken along line B-B' of FIGS. 19, 21, 23, 25, and 27, respectively.

The following will mainly describe a first region PR of the substrate 100. Referring to FIGS. 19, 20A, and 20B, a patterning process may be performed such that the sacrificial layers SAC and the semiconductor layers SEL are patterned to form a first preliminary pattern PAP1 on the first region PR of the substrate 100. During the patterning process, an upper portion of the substrate 100 may be etched to form a trench TR that defines first active patterns AP1.

The trench TR may define the first active patterns AP1, while extending in a second direction D2. The trench TR may be formed between a pair of first active patterns AP1 that are adjacent to each other in a first direction D1.

The first preliminary pattern PAP1 may be disposed on the first active pattern AP1. The first preliminary pattern PAP1 may vertically overlap the first active pattern AP1. For example, the first preliminary pattern PAP1 may have a planar shape substantially the same as that of the first active pattern AP1. The first preliminary pattern PAP1 and the first active pattern AP1 may be formed to have a linear or bar shape extending in the second direction D2.

A device isolation layer ST may be formed to fill the trench TR. The formation of the device isolation layer ST may include forming a dielectric layer on the entire surface of the substrate 100 and recessing the dielectric layer to completely expose the first preliminary pattern PAP1. The device isolation layer ST may have a top surface lower than that of the first active pattern AP1.

Figure 21:
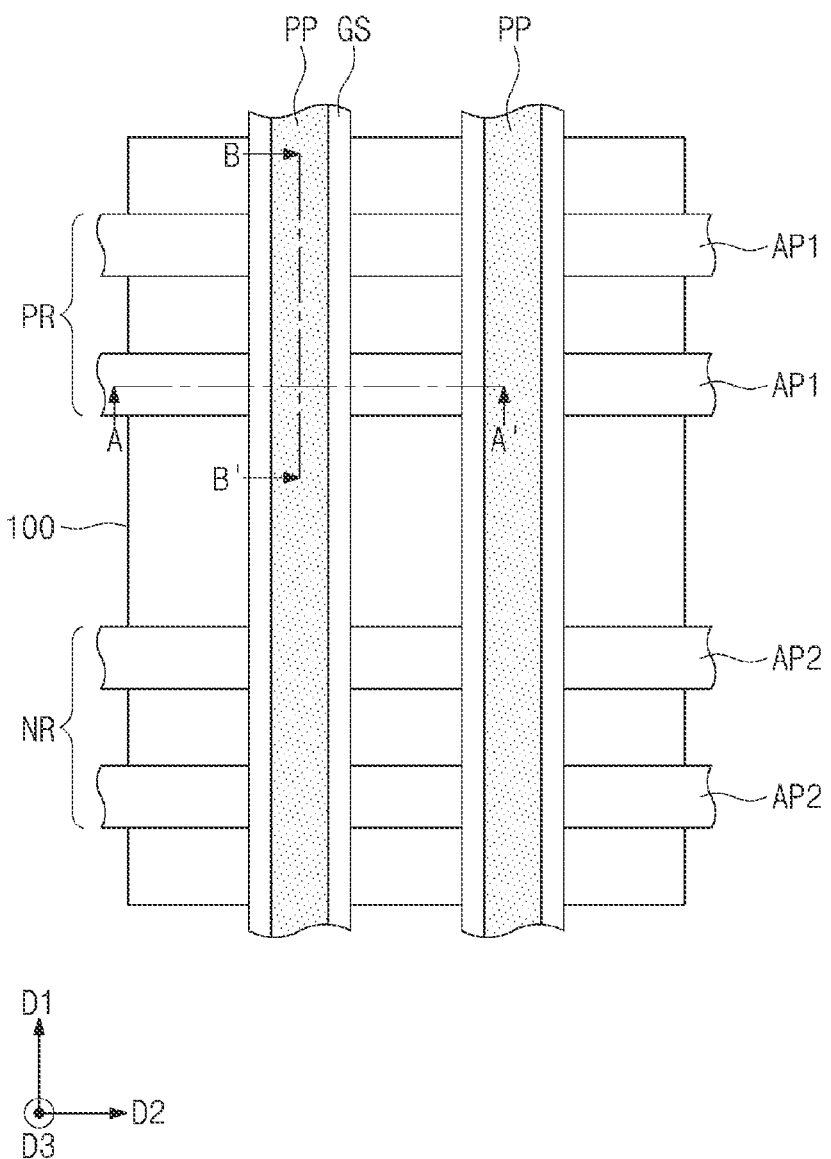
Figure 22A:
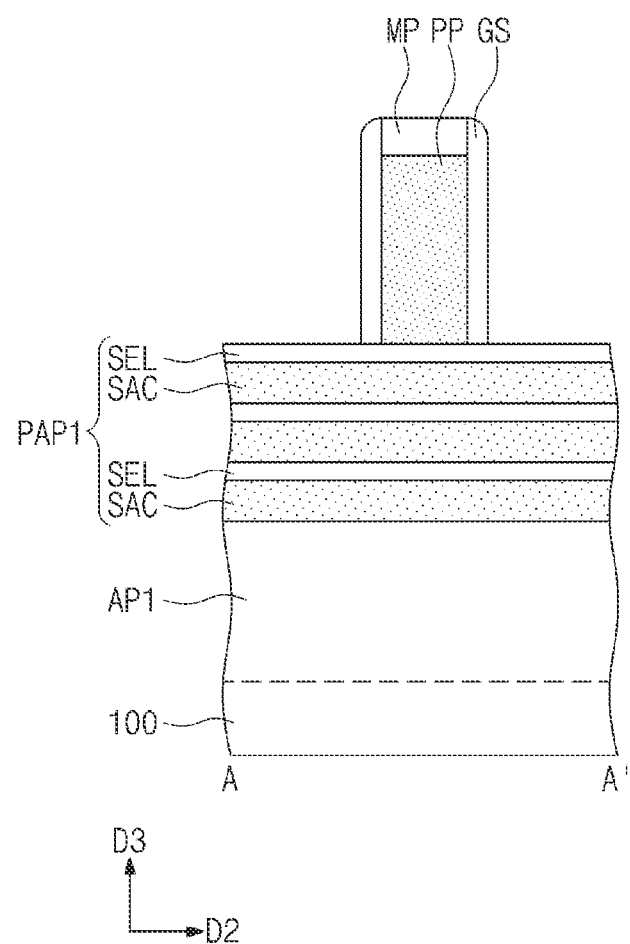
Figure 22B:
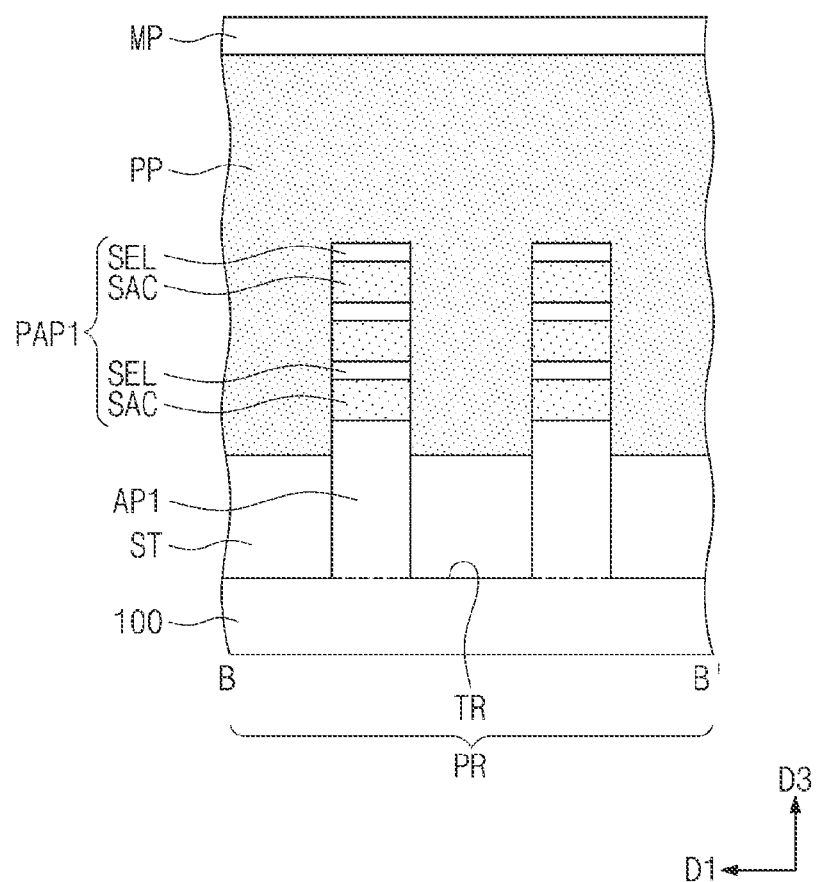
Figure 23:
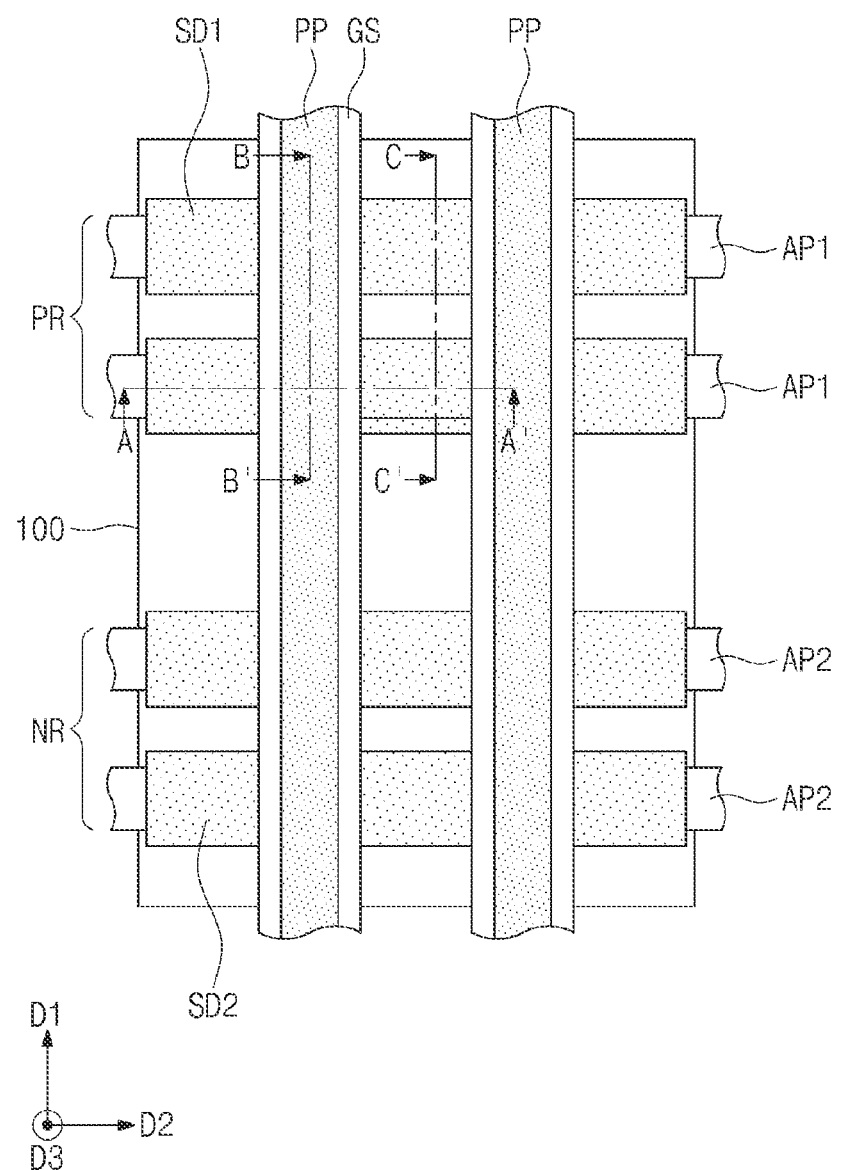

Referring to FIGS. 21, 22A, and 22B, sacrificial patterns PP may be formed to run across the first preliminary pattern PAP1. The sacrificial patterns PP may be formed to have a linear or bar shape extending in the first direction D1. The sacrificial pattern PP may be formed by a mask pattern MP that overlies the sacrificial pattern PP. A pair of gate spacers GS may be formed on opposite sidewalls of each of the sacrificial patterns PP.

Referring to FIGS. 23 and 24A to 24C, the mask patterns MP and the gate spacers GS may be used as an etching mask to etch the first preliminary pattern PAP1 to form a first channel pattern CH1. The semiconductor layers SEL of the first preliminary pattern PAP1 may be patterned to form first, second, and third semiconductor patterns SP1, SP2, and SP3. The first channel pattern CH1 may include the first, second, and third semiconductor patterns SP1, SP2, and SP3.

While the first channel pattern CH1 is formed, the first preliminary pattern PAP1 may be etched to form first recesses RS1. The first recess RS1 may be formed between a pair of adjacent first channel patterns CH1.

First source/drain patterns SD1 may be formed to fill the first recesses RS1. The formation of the first source/drain patterns SD1 may include performing a selective epitaxial growth process in which the first active pattern AP1 and the first, second, and third semiconductor patterns SP1, SP2, and SP3 on the first active pattern AP1 are used as a seed layer.

Referring to FIGS. 25 and 26A to 26C, a first interlayer dielectric layer 110 may be formed on the substrate 100. After that, a planarization process may be performed on the first interlayer dielectric layer 110 until top surfaces of the sacrificial patterns PP are exposed.

A removal process may be performed to selectively remove the sacrificial patterns PP exposed when the planarization process is carried out. The removal of the sacrificial patterns PP may form an empty space between a pair of adjacent gate spacers GS. The empty space may expose the sacrificial layers SAC and the first, second, and third semiconductor patterns SP1, SP2, and SP3.

A removal process may be performed to selectively remove the sacrificial layers SAC exposed to the empty space. While the sacrificial layers SAC are etched, the first, second, and third semiconductor patterns SP1, SP2, and SP3 may not be etched, but may remain. The selective removal of the sacrificial layers SAC may cause the empty space to expose top and bottom surfaces and sidewalls of each of the first, second, and third semiconductor patterns SP1, SP2, and SP3.

The empty space may include a first space SA1 and a second space SA2. To be specific, the selective removal of the sacrificial layers SAC may define the first space SA1 between a pair of vertically adjacent ones of the first, second, and third semiconductor patterns SP1, SP2, and SP3. For example, the first space SA1 may be defined between the first semiconductor pattern SP1 and the second semiconductor pattern SP2. The second space SA2 may be defined on an uppermost semiconductor pattern, or the third semiconductor pattern SP3.

Referring to FIGS. 27 and 28A to 28C, a gate dielectric layer GIL may be conformally formed on the exposed first, second, and third semiconductor patterns SP1, SP2, and SP3 and on an exposed upper portion of the first active pattern AP1. The gate dielectric layer GIL may partially fill each of the first and second spaces SA1 and SA2. A first work function metal layer WFL1 may be conformally formed on the gate dielectric layer GIL. The first work function metal layer WFL1 may partially fill each of the first and second spaces SA1 and SA2.

A filling material FM may be formed on the first work function metal layer WFL1. The filling material FM may completely fill the first space SAL. The filling material FM may fill a lower portion of the second space SA2.

Referring back to FIGS. 15 and 16A to 16F, the filling material FM may be used as a mask to etch the first work function metal layer WFL1 and the gate dielectric layer GIL to respectively form a first metal pattern WF1 and a gate dielectric pattern GI. For example, the first work function metal layer WFL1 and the gate dielectric layer GIL may be chamfered to form the first metal pattern WF1 and the gate dielectric pattern GI, respectively. Afterwards, the filling material FM may be selectively removed.

A second metal pattern WF2, a first barrier pattern WF3, and a second barrier pattern WF4 may be sequentially formed on the first metal pattern WF1. The second metal pattern WF2 may completely fill the first space SAL. Therefore, the first space SA1 may not have the first barrier pattern WF3 and the second barrier pattern WF4 therein. An electrode pattern EL may be formed on the second barrier pattern WF4. The patterns WF1 to WF4 and the electrode pattern EL may constitute a gate electrode GE.

A gate capping pattern GP may be formed on the gate electrode GE. A second interlayer dielectric layer 120 may be formed on the first interlayer dielectric layer 110. An active contact AC may be formed to penetrate the first and second interlayer dielectric layers 110 and 120 and to have connection with the first source/drain pattern SD1.

Figure 29:
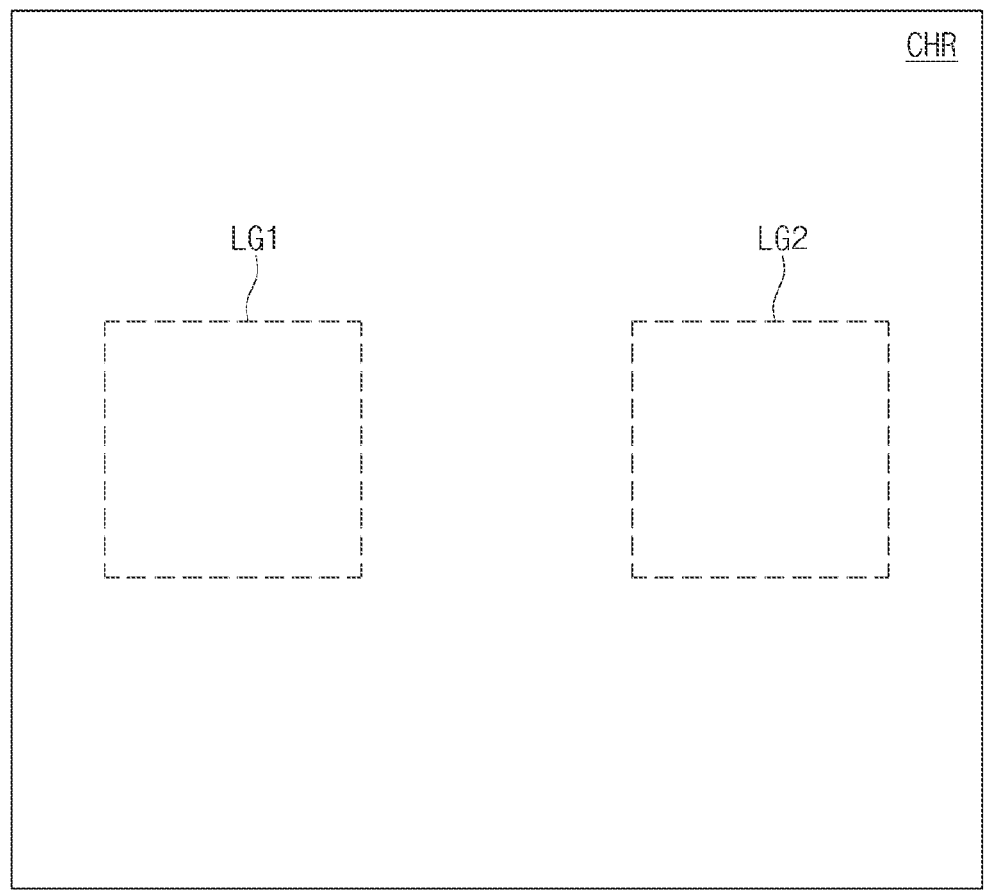
FIG. 29 illustrates a plan view showing a chip region of a semiconductor device according to some example embodiments of the present inventive concepts.

FIG. 29 illustrates a plan view showing a chip region of a semiconductor device according to some example embodiments of the present inventive concepts.

Referring to FIG. 29, a chip region CHR of a semiconductor device may include a plurality of logic regions. For example, the chip region CHR may include a first logic region LG1 and a second logic region LG2. The chip region CHR may be one semiconductor die (e.g., a logic die or a logic chip).

The first logic region LG1 may include transistors discussed above with reference to FIGS. 1 and 2A to 2E. For example, a FinFET may be provided on the first logic region LG1. The second logic region LG2 may include transistors discussed above with reference to FIGS. 15 and 16A to 16F. For example, a multi-bridge channel FET (MBCFET) may be provided on the second logic region LG2.

A semiconductor device according to the present inventive concepts may include an amorphous first barrier pattern that is interposed between a second metal pattern including n-type work function metal and a second barrier pattern having crystal grains. The first barrier pattern may stop the second metal pattern from receiving materials such as fluorine, and accordingly may reduce/prevent issues associated with a reduction in effective work functions of gate electrode. As a result, it may be possible to achieve desired threshold voltages of transistors.

Although some example embodiments of the present inventive concepts have been discussed with reference to accompanying figures, it will be understood that various changes in form and details may be made therein without departing from the scope of the present inventive concepts. It therefore will be understood that the embodiments described above are just illustrative but not limitative in all aspects.

What is claimed is:
1. A semiconductor device comprising:
a pair of source/drain patterns on a substrate,
a channel pattern between the pair of source/drain patterns, the channel pattern including a plurality of semiconductor patterns that are vertically stacked and spaced apart from each other; and
a gate electrode on the channel pattern, the gate electrode surrounding each of the plurality of semiconductor patterns,
wherein the gate electrode includes:
a first metal nitride layer;
an amorphous metal layer on the first metal nitride layer, the amorphous metal layer including tungsten (W), carbon (C), and nitrogen (N); and
a second metal nitride layer on the amorphous metal layer.
2. The semiconductor device of claim 1,
wherein the first metal nitride layer is in a first space between adjacent ones of the plurality of semiconductor patterns, and
wherein the amorphous metal layer and the second metal nitride layer are excluded from the first space.

3. The semiconductor device of claim 2, wherein the amorphous metal layer and the second metal nitride layer are in a second space that is on an uppermost one of the plurality of semiconductor patterns.

4. The semiconductor device of claim 2,
wherein the gate electrode further includes a metal carbide layer between the first metal nitride layer and the amorphous metal layer, and
wherein the metal carbide layer is in the first space.

5. The semiconductor device of claim 4, wherein a work function of the metal carbide layer is lower than a work function of the first metal nitride layer.

6. The semiconductor device of claim 4, wherein the metal carbide layer includes aluminum-doped titanium carbide (TiAlC), aluminum-doped tantalum carbide (TaAlC), aluminum-doped vanadium carbide (VAlC), silicon-doped titanium carbide (TiSiC), silicon-doped tantalum carbide (TaSiC), aluminum-silicon-doped titanium carbide (TiAlSiC), aluminum-silicon-doped tantalum carbide (TaAlSiC), or aluminum-doped titanium (TiAl).

7. The semiconductor device of claim 1, wherein each of the first and second metal nitride layers includes a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer.

8. The semiconductor device of claim 1, wherein the second metal nitride layer has a plurality of crystal grains and a grain boundary between the crystal grains.

9. The semiconductor device of claim 1,
wherein an atomic percent of W in the amorphous metal layer is greater than an atomic percent of C in the amorphous metal layer, and
wherein the atomic percent of W in the amorphous metal layer is greater than an atomic percent of N in the amorphous metal layer.

10. The semiconductor device of claim 1, wherein a thickness of the second metal nitride layer is greater than a thickness of the amorphous metal layer.

11. A semiconductor device comprising:
a pair of source/drain patterns on a substrate,
a channel pattern between the pair of source/drain patterns, the channel pattern including a plurality of semiconductor patterns that are vertically stacked and spaced apart from each other; and
a gate electrode on the channel pattern, the gate electrode surrounding each of the plurality of semiconductor patterns,
wherein the gate electrode includes:
a p-type work function metal layer;
a n-type work function metal layer on the p-type work function metal layer; and
a barrier layer on the n-type work function metal layer, the barrier layer including an amorphous metal layer that includes tungsten (W), carbon (C), and nitrogen (N),
wherein the p-type and n-type work function metal layers are in a first space between adjacent ones of the plurality of semiconductor patterns, and
wherein the barrier layer excluded from the first space.

12. The semiconductor device of claim 11, wherein the barrier layer is in a second space that is on an uppermost one of the plurality of semiconductor patterns.

13. The semiconductor device of claim 11, further comprising a gate dielectric layer between the gate electrode and each of the plurality of semiconductor patterns,
wherein the gate dielectric layer is in the first space.

14. The semiconductor device of claim 11,
wherein the p-type work function metal layer includes a metal nitride layer comprising a titanium nitride (TiN) layer, a tantalum nitride (TaN) layer, a titanium oxynitride (TiON) layer, a titanium silicon nitride (TiSiN) layer, a titanium aluminum nitride (TiAlN) layer, a tungsten carbon nitride (WCN) layer, or a molybdenum nitride (MoN) layer, and
wherein the n-type work function metal layer includes aluminum-doped titanium carbide (TiAlC), aluminum-doped tantalum carbide (TaAlC), aluminum-doped vanadium carbide (VAlC), silicon-doped titanium carbide (TiSiC), silicon-doped tantalum carbide (TaSiC), aluminum-silicon-doped titanium carbide (TiAlSiC), aluminum-silicon-doped tantalum carbide (TaAlSiC), or aluminum-doped titanium (TiAl).

15. The semiconductor device of claim 11,
wherein an atomic percent of W in the barrier layer is greater than an atomic percent of C in the barrier layer, and
wherein the atomic percent of W in the barrier layer is greater than an atomic percent of N in the barrier layer.

16. A semiconductor device comprising:
a substrate including an active pattern;
a device isolation layer that is on a sidewall of the active pattern;
a plurality of semiconductor patterns on the active pattern, the plurality of semiconductor patterns being vertically stacked and spaced apart from each other;
a gate dielectric layer surrounding each of the plurality of semiconductor patterns; and
a gate electrode on the gate dielectric layer,
wherein the gate electrode includes:
a work function metal layer in a space between adjacent ones of the plurality of semiconductor patterns;
a first barrier layer on the work function metal layer, the first barrier layer including an amorphous metal layer that includes tungsten (W), carbon (C), and nitrogen (N); and
a second barrier layer on the first barrier layer,
wherein a thickness of the first barrier layer is in a range of 1 nanometers (nm) to 5 nm,
wherein the second barrier layer includes a metal nitride layer, and a thickness of the second barrier layer is in a range of 5 nm to 70 nm.

17. The semiconductor device of claim 16, wherein first and second barrier layers are excluded from the space between the adjacent ones of the plurality of semiconductor patterns.

18. The semiconductor device of claim 16, wherein the work function metal layer includes a p-type work function metal layer on the gate dielectric layer and a n-type work function metal layer on the p-type work function metal layer.

19. The semiconductor device of claim 16,
wherein an atomic percent of W in the first barrier layer is greater than an atomic percent of C in the first barrier layer, and
wherein the atomic percent of W in the first barrier layer is greater than an atomic percent of N in the first barrier layer.

20. The semiconductor device of claim 16,
wherein the gate electrode further includes a metal layer on the second barrier layer, and
wherein the metal layer includes at least one low-resistance metal comprising aluminum (Al), W, titanium (Ti), or tantalum (Ta).

* * * * *